United States Patent
Kohno et al.

[11] Patent Number: 6,125,071
[45] Date of Patent: Sep. 26, 2000

[54] SEMICONDUCTOR MEMORY DEVICE WITH HIGH DATA READ RATE

[75] Inventors: Fumihiro Kohno; Haruki Toda, both of Yokohama, Japan

[73] Assignee: Kabushiki Kaisha Toshiba, Kawasaki, Japan

[21] Appl. No.: 09/296,268

[22] Filed: Apr. 22, 1999

[30] Foreign Application Priority Data

Apr. 22, 1998 [JP] Japan .................................. 10-111698

[51] Int. Cl.⁷ ...................................................... G11C 8/00
[52] U.S. Cl. ........................................ 365/230.03; 365/72
[58] Field of Search ................................ 365/230.03, 72

[56] References Cited

U.S. PATENT DOCUMENTS 5,060,230  10/1991  Arimoto et al. ........................ 365/201
5,793,695  8/1998  Kohno ................................ 365/230.06

OTHER PUBLICATIONS

Shigetoshi Wakayama et al.; "10–ns Row Cycle DRAM Using Temporal Data Storage Buffer Architecture" VLSI Circuit Symposium; Jun. 11, 1998.

Primary Examiner—David Nelms
Assistant Examiner—M. Tran
Attorney, Agent, or Firm—Banner & Witcoff, Ltd.

[57] ABSTRACT

A memory cell array has a plurality of memory cells arranged in a matrix. A row decoder has a multiple selection period when a plurality of word lines are simultaneously selected and word lines are sequentially selected. A plurality of sense amplifiers are arranged for each bit line. These sense amplifiers are selectively connected to the bit lines by switch circuits formed on the bit lines. A sense amplifier receives data from memory cells on one bit line through a switch circuit. A plurality of word lines are simultaneously selected and sequentially set at a high level. Data from memory cells on one bit line are sequentially received by the sense amplifier and amplified.

25 Claims, 20 Drawing Sheets

SEMICONDUCTOR MEMORY DEVICE WITH HIGH DATA READ RATE

BACKGROUND OF THE INVENTION

The present invention relates to a semiconductor memory device such as a dynamic random access memory (DRAM) and, more particularly, to an improvement of its read rate.

A semiconductor memory device represented by a DRAM has a memory cell array in which a plurality of memory cells are arranged in a matrix. Each memory cell is arranged at the intersection between a word line and a bit line. When a word line and a bit line are selected on the basis of a row address and a column address, a specific memory cell is accessed.

In a semiconductor memory device with such an arrangement, the read time for a column address is shorter than that for a row address. More specifically, in the read for a row address, a word line is selected in accordance with the row address, and data in a plurality of memory cells connected to this word line are read out to a corresponding bit line. For this reason, the read time is long. To the contrary, in the read for a column address, when the row address is determined, data in memory cells connected to this word line have already been read out to the bit line, as described above. For this reason, for the column system, data can be read out by only selecting a bit line, so the read time can be made shorter than that for the row system.

As a DRAM whose data transfer rate is improved by paying attention to the above characteristics, for example, an SDRAM (Synchronous DRAM) is known. In a high-speed DRAM of this type, the data transfer rate is increased by improving the read rate for the column system.

A conventional semiconductor memory device will be described in detail while exemplifying an SDRAM having a bank A and a bank B. FIG. 20 shows the arrangement of one bank of the SDRAM. Memory cell arrays 10A and 10B are formed by arraying, in a matrix, memory cells M each having a data storage capacitor and a cell transistor. In the memory cell arrays 10A and 10B, word lines WL and pairs of bit lines BL and bBL (b represents an inverted signal) extend in the row and column directions, respectively. The memory cells M on one word line WL are formed on one side of the bit line BL or bBL.

Each pair of bit lines BL and bBL of the memory cell arrays 10A and 10B is connected to a sense amplifier 50 through a pair of transistors 30a and 30b and a pair of transistors 31a and 31b. The sense amplifier 50 is shared by the memory cell arrays 10A and 10B. A row decoder 20J selects a word line WL of the memory cell array 10A on the basis of an external row address. The memory cell array 10B also has a row decoder (not shown).

FIG. 20 shows only one pair of bit lines BL and bBL. However, the memory cell arrays 10A and 10B have a plurality of pairs of bit lines BL and bBL. The pair of transistors 30a and 30b and the pair of transistors 31a and 31b are arranged in correspondence with each bit line pair. FIG. 20 shows the arrangement of, e.g., the bank A. The bank B (not shown) also has the same arrangement as that of the bank A.

The read operation of the SDRAM having the bank A and bank B (not shown) will be described below with reference to the timing chart shown in FIG. 21. The burst length is, e.g., "4", and the CAS (Column Address Strobe) latency is, e.g., "2".

To access the bank A to read out data, an activate command "Act" for activating the bank A is executed to operate the row system of the bank A (activation of bank A). More specifically, the word line WL of the bank A, which is designated by a row address Ra, is set at a high level to output data from the memory cells M connected to this word line WL to the pair of bit lines BL and bBL.

Next, a read command "Read" is executed to operate the column system of the bank A. More specifically, a pair of bit lines BL and bBL designated by a column address Ca is selected to read out data output to this bit line pair. Since the CAS latency is "2", data Aa0 to Aa3 with a burst length of 4 are continuously read out two clocks after execution of the read command.

During the data read from the bank A, the bank B is activated. For this reason, data Bb0 to Bb3 are sequentially read out from the bank B continuously following the data Aa0 to Aa3 from the bank A. At this time, the activation time of the bank B overlaps the read access to the bank A. Hence, the read access to the bank B is apparently performed at a high speed.

After this, when the row address is changed from "Rb" to "Rc" to access the bank B again, data necessary for the read have not been transferred to the sense amplifier yet (this is called a miss hit). First, a precharge command "PRE" is executed to precharge the main portions of the bank B to erase remaining data. After this, the activate command is executed to set a word line designated by the row address Rc at high level, and then, the read command is executed to sequentially read out data Bc0 to Bc3. In this case, a period Tb without data output is present between the data Bb0 to Bb3 and data Bc0 to Bc3, and the time required for precharge or activation becomes conspicuous.

As described above, according to the conventional semiconductor memory device, in a miss hit due to a change in row address, the time required for precharge or activation becomes conspicuous to lower the read rate.

BRIEF SUMMARY OF THE INVENTION

The present invention has been made to solve the above problem, and has as its object to provide a semiconductor memory device capable of increasing the speed of a read access (read access in miss hit) to a row address and improving the data transfer rate.

The object of the present invention is achieved by the following devices.

According to the present invention, there is provided a semiconductor memory device comprising: a memory cell array having memory cells, word lines, and bit line pairs, the memory cells being arranged at intersections between the word lines and the bit line pairs; a row decoder for selecting the word lines; a plurality of sense amplifiers arranged in correspondence with each bit line pair to amplify data read out from memory cells to the bit line pair; and switch circuits provided between the sense amplifiers and the bit line pair to connect the bit line pair and the sense amplifiers.

According to the present invention, there is provided a semiconductor memory device comprising: a plurality of memory cell arrays having memory cells, word lines, and bit line pairs, the memory cells being arranged at intersections between the word lines and the bit line pairs; a row decoder arranged in correspondence with each memory cell array to select the word lines; a plurality of first sense amplifiers arranged between adjacent memory cell arrays and shared by bit line pairs of the adjacent memory cell arrays to amplify data read out from the memory cells to the bit line pairs; a global bit line pair formed commonly for the plurality of memory cell arrays; a second sense amplifier connected to the global bit line pair to amplify data of the global bit line pair; a plurality of first switch circuits formed between the first sense amplifiers and the bit line pairs of the memory cell arrays to connect the bit line pairs and the first sense amplifiers; and a plurality of second switch circuits formed between the global bit line pair and the bit line pairs of the memory cell arrays to connect the global bit line pair and the bit line pairs.

According to the present invention, there is provided a semiconductor memory device comprising: first and second memory cell arrays having memory cells, word lines, and bit line pairs, the memory cells being arranged at intersections between the word lines and the bit line pairs; a row decoder arranged in correspondence with each of the first and second memory cell arrays to select the word line; first and second sense amplifiers arranged in correspondence with each bit line pair of the first and second memory cell arrays to amplify data of the bit line pair; and first switch circuits formed between the first and second sense amplifiers and the bit line pair of the first memory cell array to selectively connect the first and second sense amplifiers and the bit line pair of the first memory cell array; and second switch circuits formed between the first and second sense amplifiers and the bit line pair of the second memory cell array to selectively connect the first and second sense amplifiers and the bit line pair of the second memory cell array.

According to the present invention, there is provided a semiconductor memory device, comprising: a memory cell array having memory cells, word lines, and bit line pairs, the memory cells being arranged at intersections between the word lines and the bit line pairs; a row decoder for selecting the word lines; a first sense amplifier arranged at one end portion of the bit line pair of the memory cell array to amplify data read out from memory cells to the bit line pair; a second sense amplifier arranged at the other end portion of the bit line pair of the memory cell array to amplify data read out from memory cells to the bit line pair; first switch circuits formed between the first sense amplifier and one end portion of the bit line pair to transfer data of the bit line pair to the first sense amplifier; and second switch circuits formed between the second sense amplifier and the other end portion of the bit line pair to transfer data of the bit line pair to the second sense amplifier.

According to the present invention, there is provided a semiconductor memory device comprising: a memory cell array having memory cells, word lines, and bit line pairs, the memory cells being arranged at intersections between the word lines and the bit line pairs; a row decoder for selecting the word lines of the memory cell array; and a sense amplifier for amplifying data read out from memory cells to the bit line pair, the row decoder having a decoding circuit having a synchronous logic circuit for decoding an external row address; first and second latch circuits for sequentially latching output signals from the decoding circuit; and a driving circuit for driving the word line on the basis of signals latched by the first and second latch circuits.

According to the present invention, the row decoder sequentially selects the word lines in accordance with row addresses. There is a multiple selection period when a plurality of word lines are simultaneously selected. Data read out from memory cells to one bit line pair are supplied to a plurality of sense amplifiers. For this reason, while data of memory cells connected to a certain word line are being amplified, another word line can be selected, and a read access to the row address can be pipelined. Hence, data from each memory cell can be received by each sense amplifier at a high speed, and the read operation when the row address is changed can be performed at a high speed.

According to the present invention, first and second switch circuits which are complementarily turned on in synchronism with the word line selection operation are formed, and first and second sense amplifiers to which data from memory cells are supplied through the first and second switch circuits are arranged. The first and second switch circuits can transfer data of memory cells selected later to one of the first and second sense amplifiers in the first half of the multiple selection period and transfer data held by the other of the first and second sense amplifiers to the previously selected memory cells in the second half of the multiple selection period. When data of memory cells selected later are amplified in the word line multiple selection period, data of the previously selected memory cells are re-stored. Hence, with the pipeline operation, two word lines can be simultaneously selected to read out and re-store data.

In addition, the first and second switch circuits are alternately turned on in synchronism with the word line selection operation, and data read out to the bit line pair are alternately transferred to the first and second sense amplifiers through the first and second switch circuits. For this reason, even when word lines larger in number than the sense amplifiers are sequentially driven, the sense amplifier can sequentially amplify data read out from the memory cells to the corresponding bit line pair. Hence, a high-speed read access can be realized.

The first sense amplifier is arranged in correspondence with the bit line pair of each memory cell array in a bank, and the second sense amplifier is arranged in correspondence with the global bit line pair common to the plurality of memory cell arrays in the bank. With this arrangement, the circuit scale of sense amplifiers per bank can be suppressed.

The first and second sense amplifiers are arranged between adjacent memory cell arrays and shared by the adjacent memory cell arrays. With this arrangement, the circuit scale of the sense amplifiers can be halved.

The first and second sense amplifiers are arranged at two terminals of a bit line pair on both sides of a memory cell array. With this arrangement, noise generated by the sense amplifiers can be distributed, and any erroneous operation due to noise can be prevented.

The sense amplifier is formed from a flip-flop formed by cross-connecting input and output terminals of a pair of CMOS inverters. When one of a PMOS transistor pair and an NMOS transistor pair forming the CMOS inverter is shared to form sense amplifiers, the circuit scale of the sense amplifiers can be reduced.

In the row decoder of the present invention, a decoded output signal corresponding to a row address is sequentially latched by a plurality of latch circuits. Even when the row address changes, the preceding state of the decoded output signal can be held. Hence, a plurality of word lines can be simultaneously selected and sequentially activated.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Figure 20:
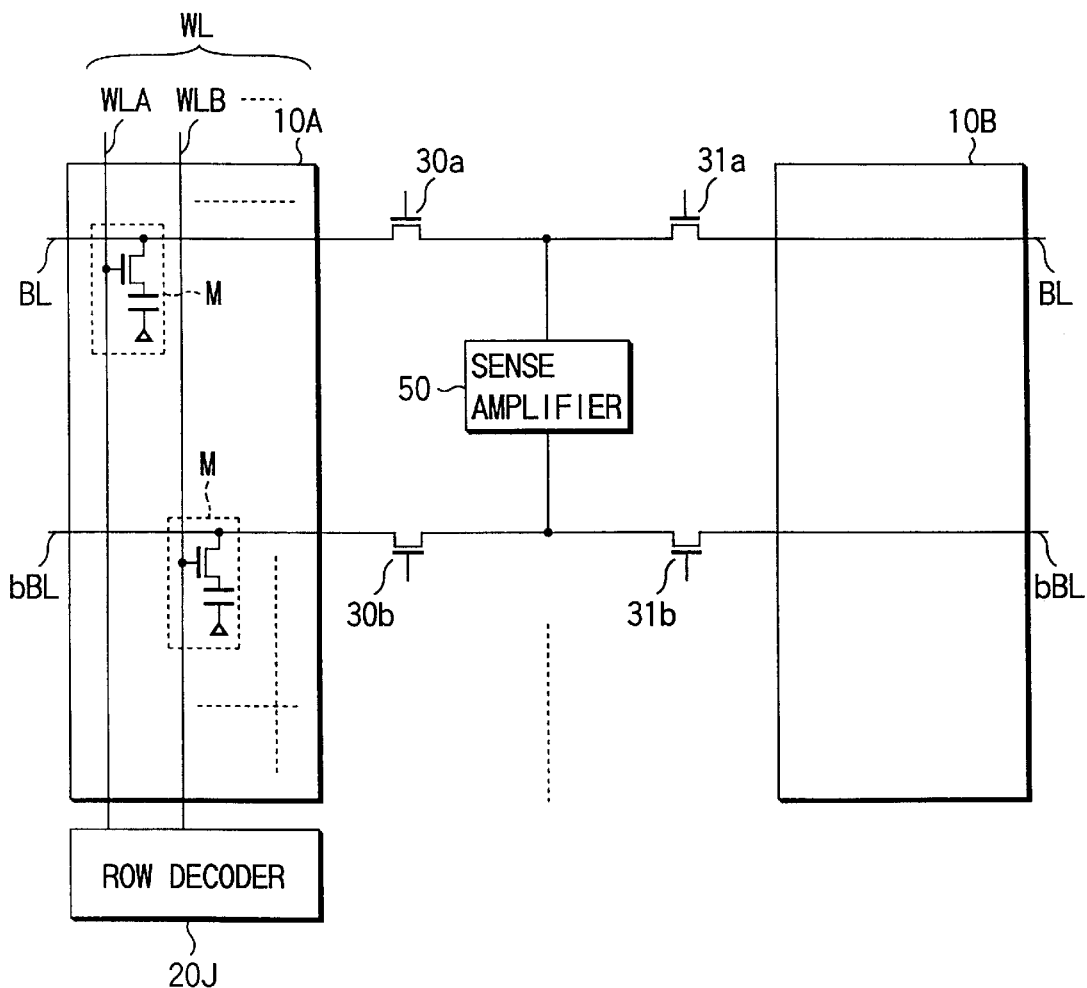
FIG. 20 is a block diagram showing the arrangement of a conventional semiconductor memory device.
Figure 21:
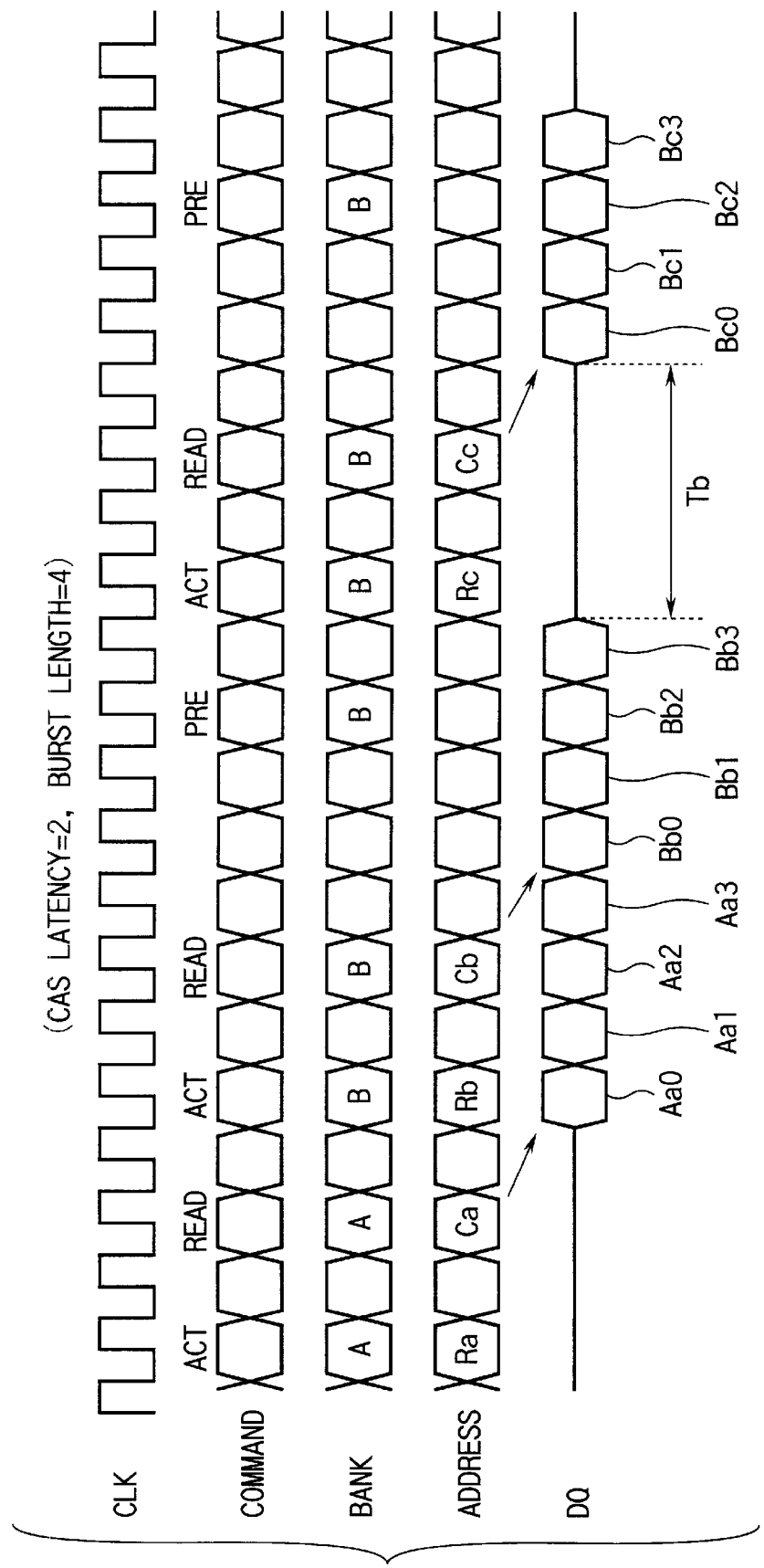
FIG. 21 is a timing chart for explaining the operation of the conventional semiconductor memory device.

The embodiments of the present invention will be described below with reference to the accompanying drawing. The same reference numerals as in FIG. 20 denote the same elements throughout the drawing, and a detailed description thereof will be omitted.

Figure 1:
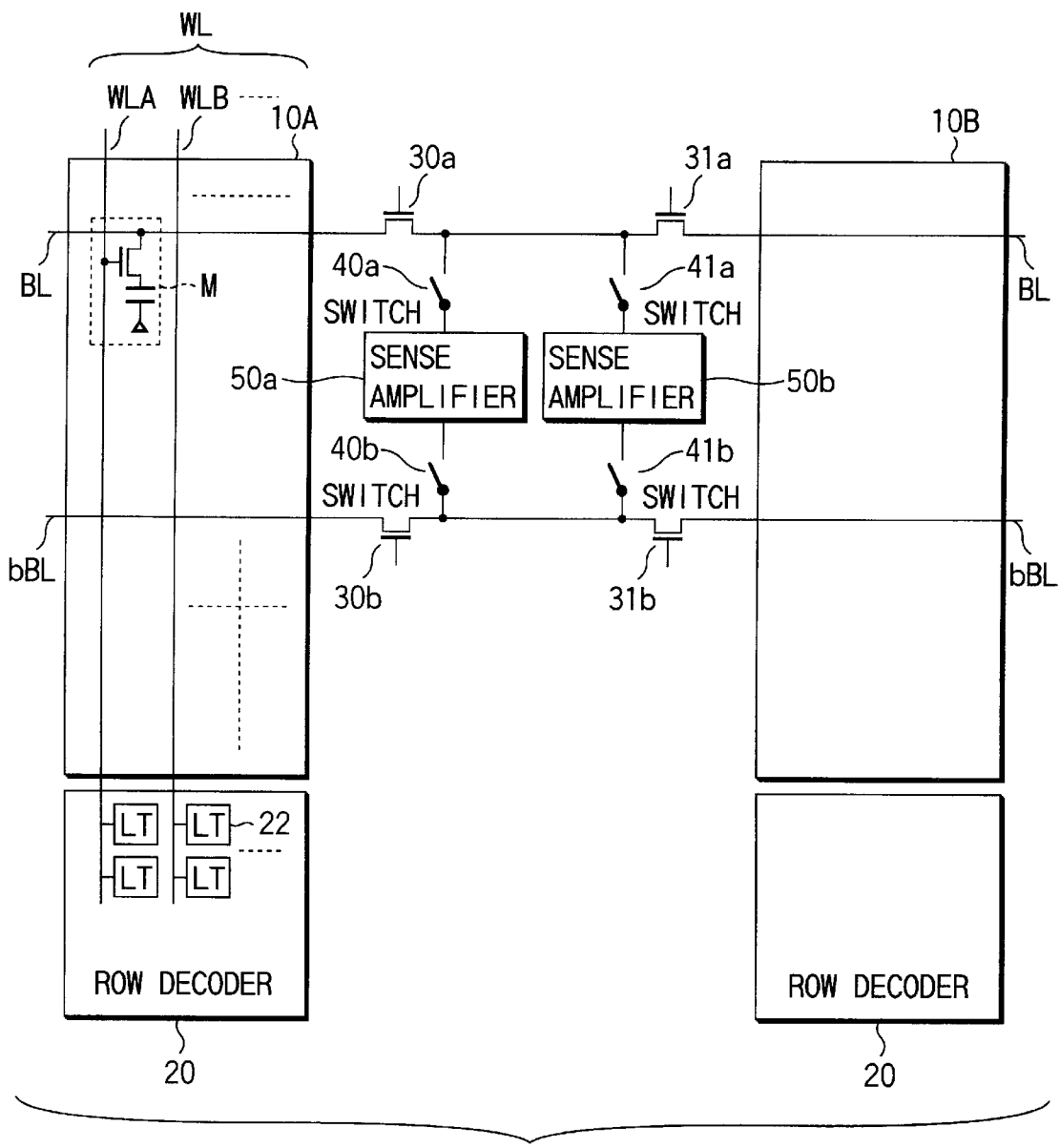
FIG. 1 is a block diagram showing a semiconductor memory device according to the first embodiment of the present invention.

FIG. 1 shows a semiconductor memory device according to the first embodiment of the present invention. Two sense amplifiers 50a and 50b are arranged for each pair of bit lines BL and bBL of memory cell arrays 10A and 10B. The sense amplifiers 50a and 50b are connected to the memory cell arrays 10A and 10B through transistors 30a and 30b and transistors 31a and 31b and shared by the memory cell arrays. The sense amplifiers 50a and 50b are selected by switches 40a and 40b and switches 41a and 41b.

A row decoder 20 for selecting a word line WL is arranged for each of the memory cell arrays 10A and 10B. The row decoder 20 has a multiple selection period for simultaneously selecting a plurality of word lines and sequentially selecting the word lines WL. The row decoder 20 has a plurality of latch circuits (LTs) 22 for latching a decoding result (decoded output signal). The row decoder 20 will be described later in detail.

Figure 2:
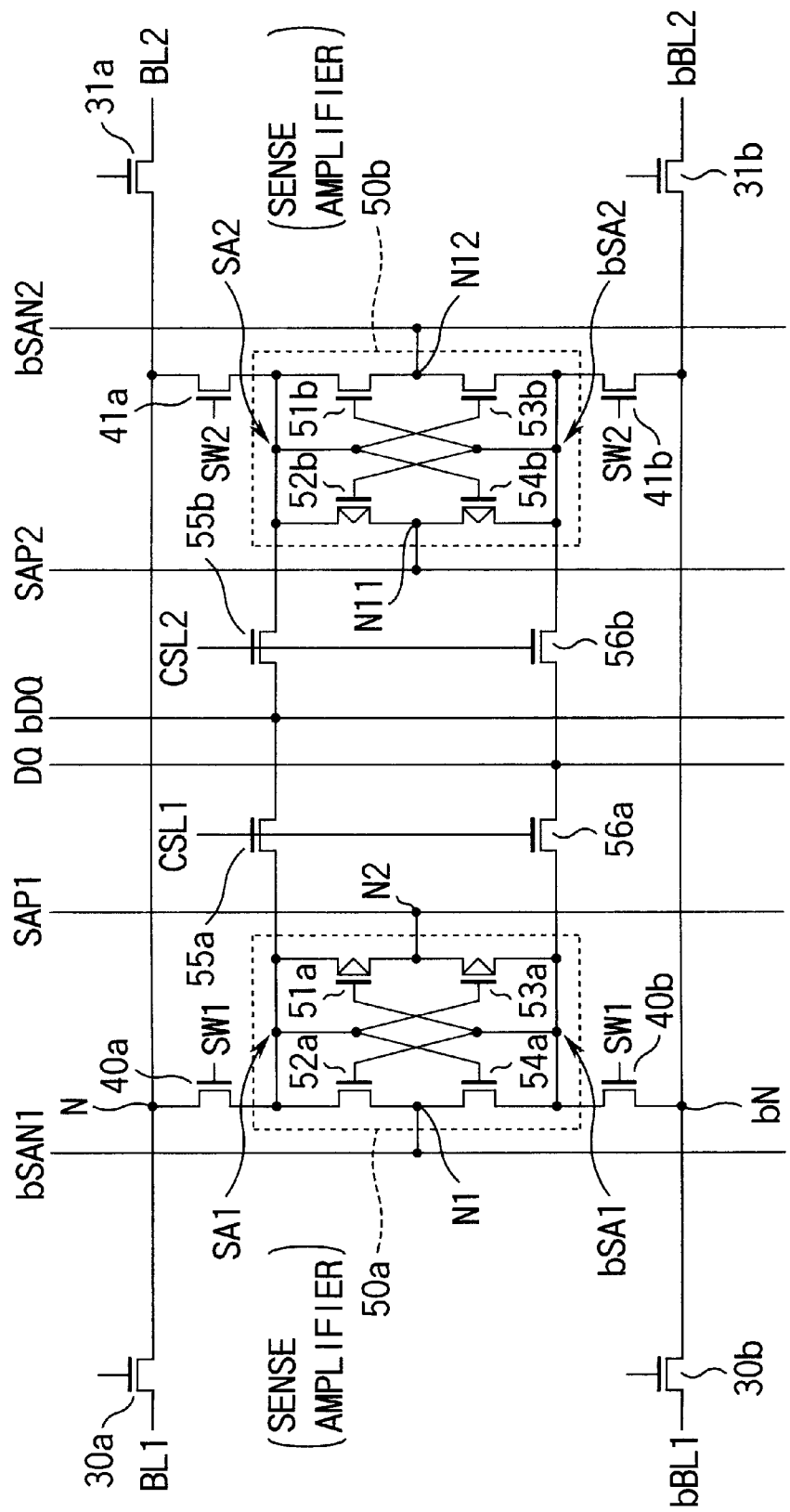
FIG. 2 is a circuit diagram showing the arrangement of a sense amplifier shown in FIG. 1.

FIG. 2 shows the arrangement of the sense amplifiers 50a and 50b and their peripheral circuits. As shown in FIG. 2, one end of the current path of the transfer NMOS transistor 30a is connected to a bit line BL1 of the memory cell array 10A, and the other end is connected to a node N. A control signal for ON/OFF-controlling the transistor 30a is supplied to the gate electrode of the transistor 30a. One end of the current path of the switch NMOS transistor 40a is connected to the node N, and the other end is connected to a detection point SA1 of the sense amplifier 50a. A control signal SW1 for ON/OFF-controlling the transistor 40a is supplied to the gate electrode of this transistor at a timing to be described later. One end of the current path of an NMOS transistor 55a is connected to the detection point SA1, and the other end is connected to a data line bDQ. A column selection signal CSL1 is supplied to the gate electrode.

One end of the current path of the transfer NMOS transistor 30b is connected to a bit line bBL1 of the memory cell array 10A, and the other end is connected to a node bN. A control signal for ON/OFF-controlling the transistor 30b is supplied to the gate electrode of the transistor 30b. One end of the current path of the activation NMOS transistor 40b is connected to the node bN, and the other end is connected to a detection point bSA1 of the sense amplifier 50a. The control signal SW1 for ON/OFF-controlling the transistor 40b is supplied to the gate electrode of this transistor at a timing to be described later. One end of the current path of an NMOS transistor 56a is connected to the detection point bSA1, and the other end is connected to a data line DQ. The column selection signal CSL1 is supplied to the gate electrode.

The current path of an NMOS transistor 52a is connected between the detection point SA1 and an intermediate node N1. The current path of an NMOS transistor 54a is connected to the detection point bSA1 and intermediate node N1. The current path of a PMOS transistor 51a is connected between the detection point SA1 and an intermediate node N2. The current path of a PMOS transistor 53a is connected between the detection point bSA1 and intermediate node N2. The detection point SA1 is connected to the gate electrodes of the transistors 54a and 53a, and the detection point bSA1 is connected to the gate electrodes of the transistors 51a and 52a. A control signal bSAN1 is supplied to the node N1, and a control signal SAP1 is supplied to the node N2.

That is, in the sense amplifier 50a, the input and output terminals of a CMOS inverter formed from the PMOS transistor 51a and NMOS transistor 52a are connected to the detection points bSA1 and SA1, respectively, and the input and output terminals of a CMOS inverter formed from the PMOS transistor 53a and NMOS transistor 54a are connected to the detection points SA1 and bSA1, respectively.

One end of the current path of the transfer NMOS transistor 31a is connected to a bit line BL2 of the memory cell array 10B, and the other end is connected to the node N. A control signal for ON/OFF-controlling the transfer transistor 31a is supplied to the gate electrode. One end of the current path of the switch NMOS transistor 41a is connected to the node N, and the other end is connected to a detection point SA2 of the sense amplifier 50b. A control signal SW2 for ON/OFF-controlling this transistor is supplied to the gate electrode at a timing to be described later. One end of the current path of an NMOS transistor 55b is connected to the detection point SA2, and the other end is connected to the data line bDQ. A column selection signal CSL2 is supplied to the gate electrode.

One end of the current path of the transfer NMOS transistor 31b is connected to a bit line bBL2 of the memory cell array 10B, and the other end is connected to the node bN. A control signal for ON/OFF-controlling the transfer transistor 31b is supplied to the gate electrode. One end of the current path of the activation NMOS transistor 41b is connected to the node bN, and the other end is connected to a detection point bSA2 of the sense amplifier 50b. The control signal SW2 for ON/OFF-controlling this transistor is supplied to the gate electrode at a timing to be described later. One end of the current path of an NMOS transistor 56b is connected to the detection point bSA2, and the other end is connected to the data line DQ. The column selection signal CSL2 is supplied to the gate electrode.

The current path of a PMOS transistor 52b is connected between the detection point SA2 and an intermediate node N11. The current path of a PMOS transistor 54b is connected to the detection point bSA2 and intermediate node N11. The current path of an NMOS transistor 51b is connected between the detection point SA2 and an intermediate node N12. The current path of an NMOS transistor 53b is connected between the detection point bSA2 and intermediate node N12. The detection point SA2 is connected to the gate electrodes of the transistors 54b and 53b, and the detection point bSA2 is connected to the gate electrodes of the transistors 52b and 51b. A control signal SAP2 is supplied to the node N11, and a control signal bSAN2 is supplied to the node N12.

That is, in the sense amplifier 50b, the input and output terminals of a CMOS inverter formed from the PMOS transistor 52b and NMOS transistor 51b and a CMOS inverter formed from the PMOS transistor 54b and NMOS transistor 53b are cross-connected to the detection points SA2 and bSA2.

Figure 3:
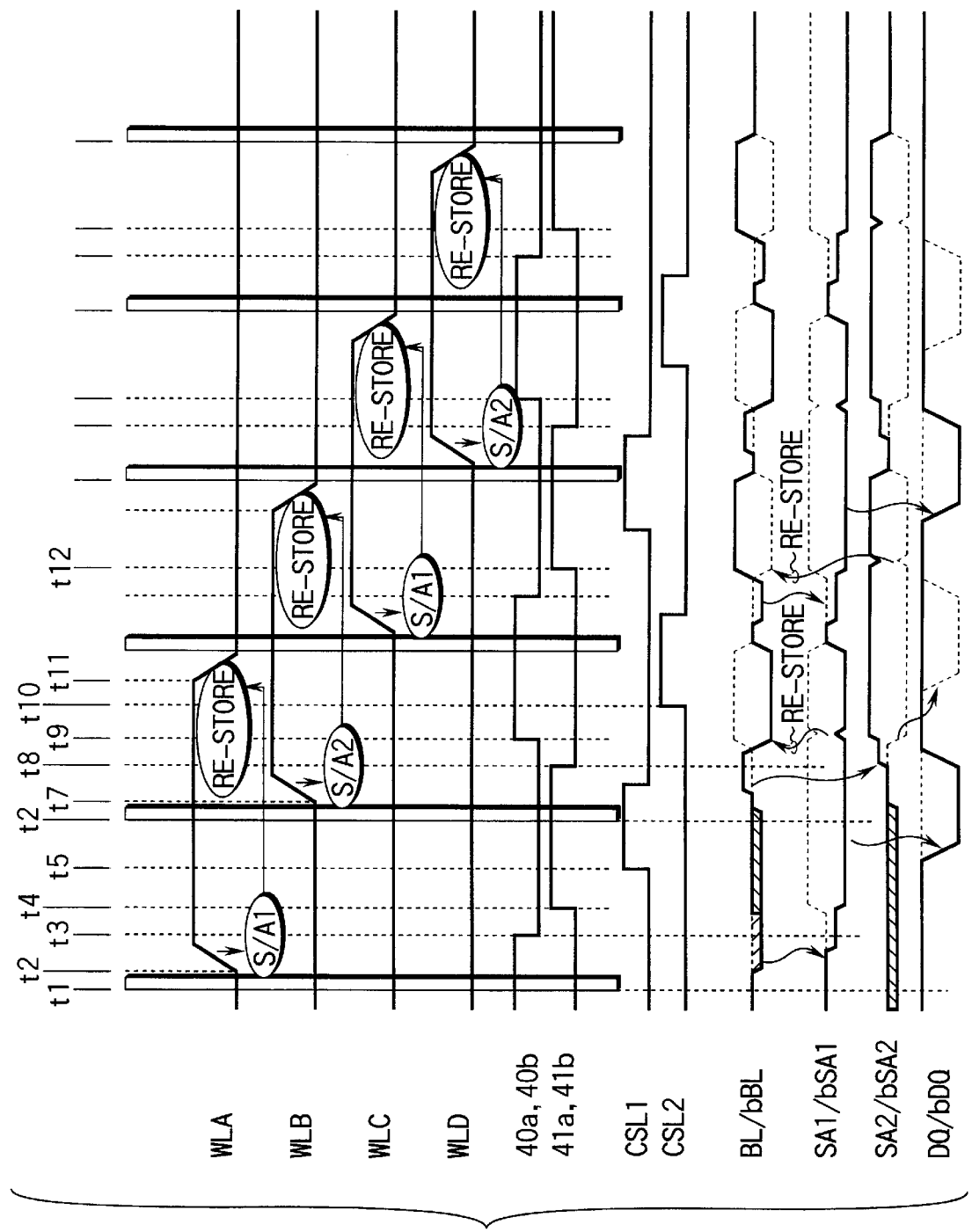
FIG. 3 is a timing chart for explaining an operation of the semiconductor memory device according to the first embodiment of the present invention.

The operation (operation in miss hit) of the row system of the semiconductor memory device according to the first embodiment will be described below with reference to FIG. 3 while exemplifying a data read from the memory cell array 10A. In the waveforms of BL/bBL and SA2/bSA2 shown in FIG. 3, the hatched regions represent indeterminate regions.

In this case, the transistors 30a and 30b shown in FIG. 2 are ON, and the transistors 31a and 31b are OFF. The sense amplifiers 50a and 50b are disconnected from the memory cell array 10B and connected to the bit lines BL and bBL of the memory cell array 10A. The bit lines BL and bBL will mean the bit lines of the memory cell array 10A hereinafter.

In the initial state, all word lines WL are unselected, the switches 40a and 40b are ON, the switches 41a and 41b are OFF, the column selection signals CSL1 and CSL2 are deactivated, and the sense amplifier 50a is connected to the bit lines BL and bBL through the switches 40a and 40b, respectively.

In this initial state, the respective portions are equalized (t1). More specifically, the bit lines BL and bBL, detection points SA1 and bSA1 of the sense amplifier 50a, and data lines DQ and bDQ are initialized to, e.g., a potential of Vcc/2. The row decoder 20 sets a first word line WLA at high level (H level) on the basis of a row address (t2). Data in memory cells connected to this word line WLA are output to the bit lines BL and bBL and supplied to the detection points SA1 and bSA1 of the sense amplifier 50a through the transistors 31a and 31b and switches 40a and 40b.

The switches 40a and 40b are turned off after a potential difference is generated between the bit lines BL and bBL in accordance with the data from the memory cells (t3). For this reason, the data are held by the sense amplifier 50a. Next, while the word line WLA is driven, the switches 41a and 41b are turned on (t4) to connect the other sense amplifier 50b to the bit lines BL and bBL.

When the switches 40a and 40b are OFF, the sense amplifier 50a amplifies and holds the data and also transfers the data to the column system. More specifically, when the switches 40a and 40b are turned off, the control signals SAP1 and bSAN1 are activated at a predetermined timing. For this reason, the sense amplifier 50a operates to amplify the potential difference between the detection points SA1 and bSA1 of the sense amplifier 50a. After this, the column selection signal CSL1 is activated on the basis of a column address (t5), and the data amplified by the sense amplifier 50a are transferred to the data lines DQ and bDQ through the transistors 55a and 56a and read out. During this time, the sense amplifier 50b is deactivated and does not perform amplification.

When the sense amplifier 50b is connected to the bit lines BL and bBL through the switches 41a and 41b, the respective portions are equalized (t6), and the detection points SA2 and bSA2 of the sense amplifier 50b are initialized.

The row decoder 20 sets a second word line WLB at high level while keeping the first word line WLA at high level (t7). That is, the row decoder 20 has a period when the word lines WLA and WLB are simultaneously driven. During this period, the word lines WLA and WLB are simultaneously selected. Data in memory cells connected to the word line WLB are output to the bit lines BL and bBL and supplied to the detection points SA2 and bSA2 of the sense amplifier 50b through the transistors 30a and 30b and switches 41a and 41b. The switches 41a and 41b are turned off after a potential difference is generated between the bit lines BL and bBL in accordance with the data from the memory cells. Hence, the data are held by the sense amplifier 50b (t8).

When the switches 41a and 41b are OFF, the sense amplifier 50b amplifies and holds the data and also transfers the data to the column system. More specifically, when the switches 41a and 41b are turned off, the control signals SAP2 and bSAN2 are activated at a predetermined timing. For this reason, the sense amplifier 50b operates to amplify the potential difference between the detection points SA2 and bSA2. After this, the column selection signal CSL2 is activated on the basis of the column address (t10), and the data amplified by the sense amplifier 50b are transferred to the data lines DQ and bDQ through the transistors 55b and 56b and read out.

When the switches 41a and 41b are turned off (t8), the following operation is performed parallel to the operation of the sense amplifier 50b. The switches 40a and 40b are turned on again (t9), and the data held by the sense amplifier 50a so far are output to the bit lines BL and bBL. For this reason, the data in the bit lines BL and bBL are re-stored in the memory cells connected to the word line WLA held at H level. At this time, since the word line WLB is also at H level, the data held by the sense amplifier 50a are re-stored in the memory cells connected to the word line WLB as error data. When re-storage is complete, the row decoder 20 sets only the word line WLA at high level (t11).

Next, a third word line WLC is selected, and data in memory cells connected to this word line WLC are read out. With the re-storage operation during the period when the word lines WLB and WLC are simultaneously selected, the data held by the sense amplifier 50b are re-stored in the memory cells connected to the word line WLB through the switches 41a and 41b as correct data (t12). In a similar manner, a fourth word line WLD is selected simultaneously with the third word line WLC, data in memory cells connected to the fourth word line WLD are read out, and the data are re-stored in the memory cells connected to the third word line WLC.

In the above series of processes of read operation, during the multiple selection of the word lines WL, a data read from memory cells connected to the word line driven later, and data re-storage in memory cells connected to the word line driven first are performed. For this reason, the next data are read out before the previously readout data are re-stored, so the read rate in a miss hit can be increased. Especially, since no re-storage is performed before the first word line WLA and second word line WLB are set at high level, the first word line WLA and second word line WLB can be more quickly set at a high level, and the read operation can be performed at a high speed.

In the first embodiment, two sense amplifiers are connected to bit lines through switches. However, the present invention is not limited to this, and the number of sense amplifiers may be increased to three or more to continuously perform the above-described drive of the first and second word lines.

Figure 4:
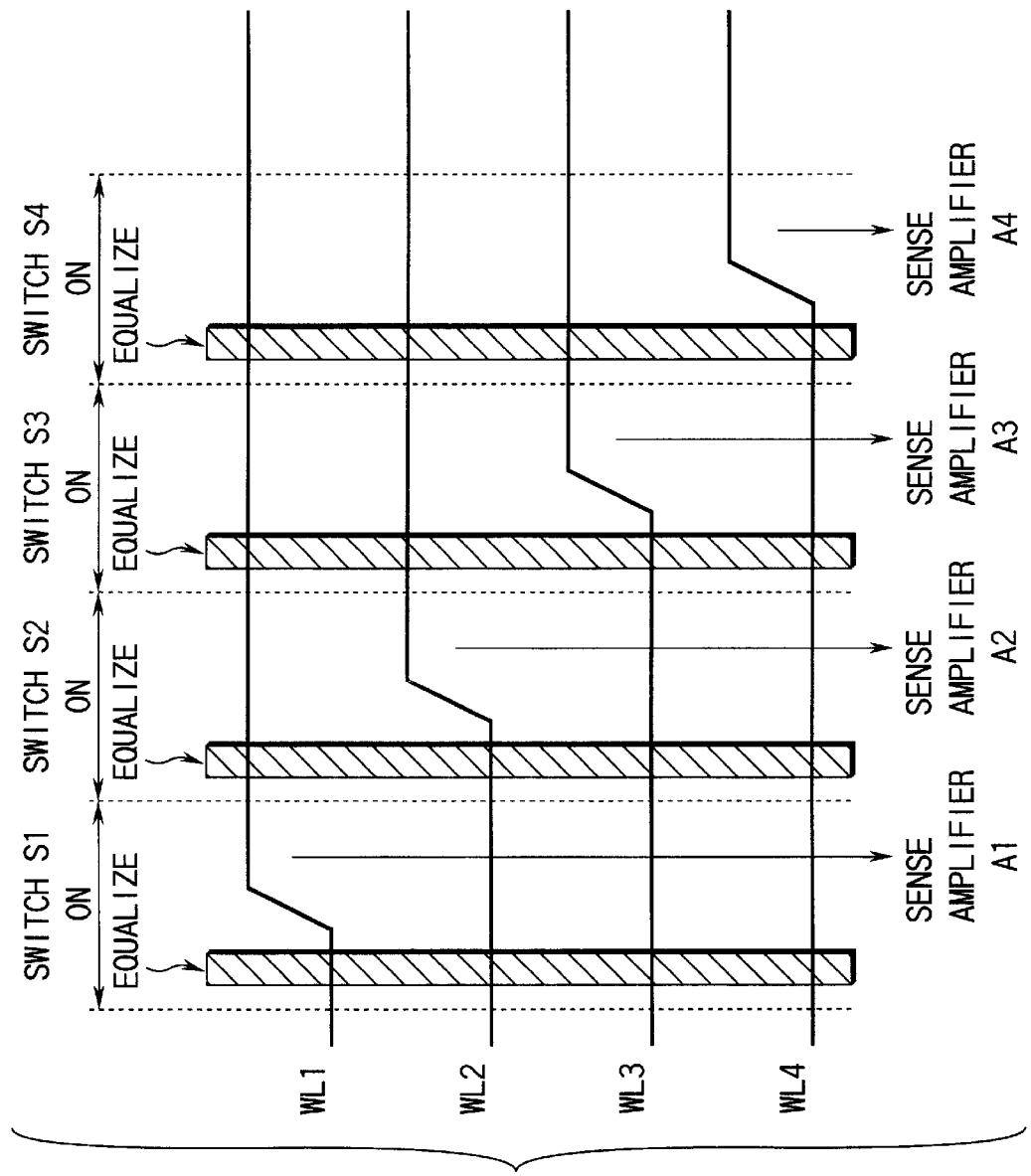
FIG. 4 is a timing chart for explaining another operation of the semiconductor memory device according to the first embodiment of the present invention.

FIG. 4 shows an operation performed when, e.g., four sense amplifiers are connected to bit lines through switches. The operation shown in FIG. 4 will be described.

In this case, sense amplifiers A1 to A4 are connected to the bit lines BL and bBL through switches S1 to S4. First, the switch S1 is turned on to equalize the respective portions, and then, a word line WL1 is set at a high level. Data from memory cells connected to the word line WL1 are amplified by the first sense amplifier A1 and transferred to data lines.

While keeping the word line WL1 at high level, the switch S1 is turned off, and the switch S2 is turned on to equalize the respective portions. A second word line WL2 is set at a high level, and data from corresponding memory cells are received and amplified by the second sense amplifier A2 and transferred to the data lines. In the same way, while the first word line WL1 and second word line WL2 are kept at a high level, the switch S2 is turned off, and the switch S3 is turned on to equalize the respective portions. A third word line WL3 is set at a high level, and data from corresponding memory cells are received and amplified by the third sense amplifier A3 and transferred to the data lines.

Finally, while the first word line WL1, second word line WL2, and third word line WL3 are kept at a high level, the switch S3 is turned off, and the switch S4 is turned on to equalize the respective portions. A fourth word line WL4 is set at a high level, and data from corresponding memory cells are received and amplified by the fourth sense amplifier A4 and transferred to the data lines. At this time point, the data from the memory cells are held by the sense amplifiers and can be re-stored in the source memory cells as needed.

As described above, a plurality of word lines are sequentially simultaneously selected, and data from memory cells connected to the word lines are received by sense amplifiers through switches. With this arrangement, even when the row address changes, the time required for precharge or activation can be inconspicuous, a read access using a row address can be performed at a high speed.

The row decoder 20 will be described next. As described above, the row decoder 20 sequentially selects the word lines WL in the multiple selection period.

Figure 5:
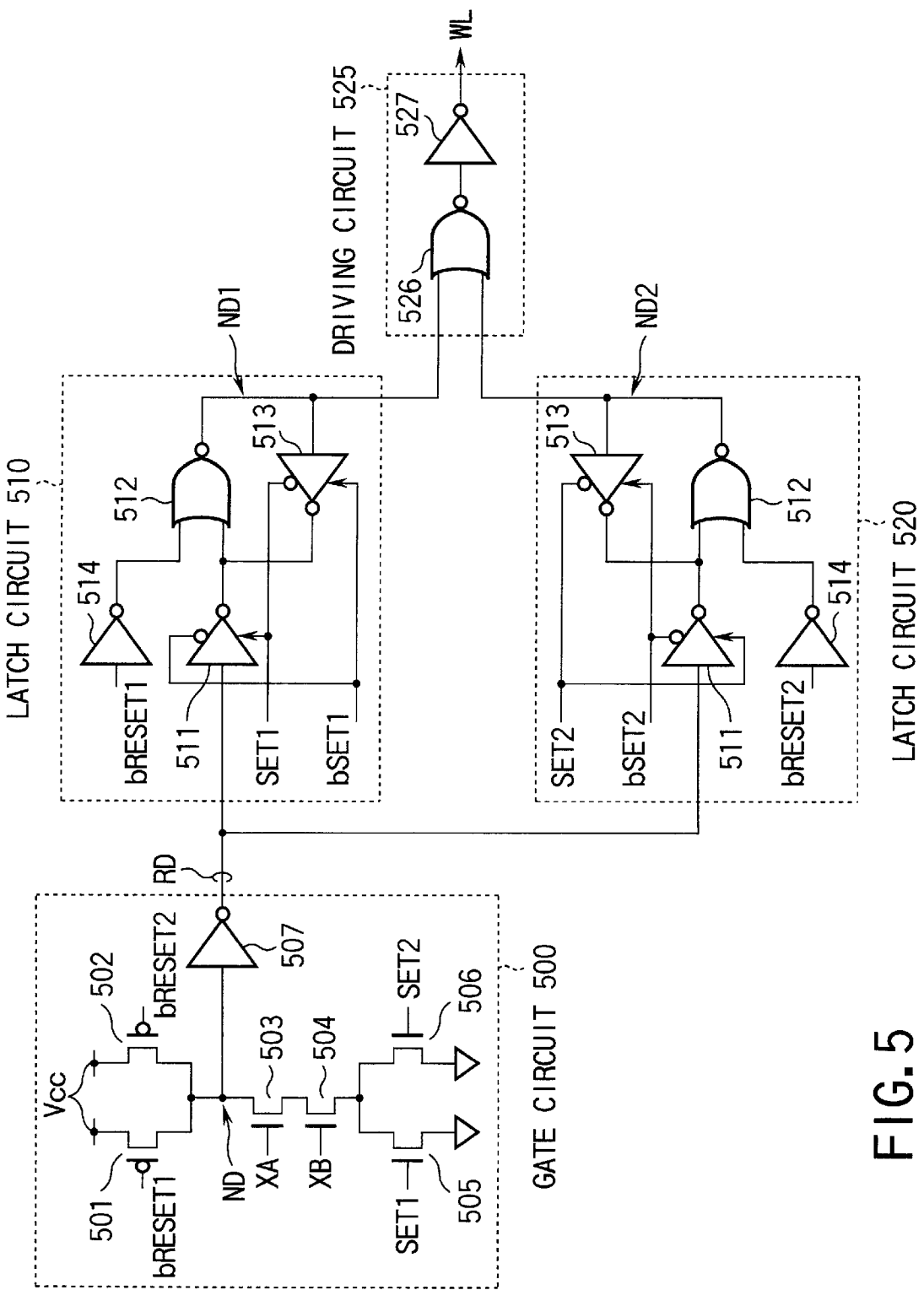
FIG. 5 is a circuit diagram showing the first specific example of a decoder unit circuit (row decoder)

FIG. 5 is a circuit diagram showing the first specific example of the row decoder 20 and shows a circuit (to be referred to as a decoder unit circuit hereinafter) as the basic unit of the row decoder 20. One decoder unit circuit is arranged for one word line. Hence, the row decoder 20 has a plurality of decoder unit circuits equal in number to the word lines.

The decoder unit circuit sets the word line WL at a high level basically when both row addresses XA and XB are at logic "1". In this example, the row addresses XA and XB are predecoded in advance. A plurality of row addresses XA and XB are present in accordance with addresses before predecoding. A combination of the row addresses XA and XB is supplied to the decoder unit circuit.

Referring to FIG. 5, a gate circuit 500 is the decoding circuit of the row decoder main body and is formed from a synchronous AND circuit controlled by reset signals bRESET1 and bRESET2 and set signals SET1 and SET2. The gate circuit 500 detects that both the row addresses XA and XB are at logic "1" and outputs a signal of logic "1" as a decoded output signal RD. More specifically, one end of the current path of two precharge PMOS transistors 501 and 502 is connected to a power supply Vcc, and the other end is connected to a node ND. The reset signals bRESET1 and bRESET2 for ON/OFF-controlling the transistors 501 and 502 are supplied to the gate electrodes of these transistors at a timing to be described later. NMOS transistors 503 and 504 series-connected to the node ND are decoding transistors. The row addresses XA and XB are supplied to the gate electrodes. One terminal of the transistor 504 is grounded through two ground potential supply NMOS transistors 505 and 506. The set signals SET1 and SET2 for ON/OFF-controlling the transistors 505 and 506 are supplied to the gate electrodes of these transistors at a timing to be described later. The node ND is connected to the output terminal RD through an inverter 507. The output terminal RD corresponds to the output terminal of the gate circuit 500.

According to the gate circuit 500, the transistors 501 and 505 are sequentially turned on the basis of the reset signal bRESET1 and set signal SET1 to perform reset and matching detection of the row addresses XA and XB. More specifically, when the ground potential supply transistor 505 is OFF, the precharge transistor 501 is turned on to precharge the floating node ND. After this, the transistor 501 is turned off, and the transistor 505 is turned on. When both the row addresses XA and XB are at logic "1" the node ND is grounded through the transistors 503, 504, and 505. Consequently, the decoded output signal RD is set at logic "1" and activated to detect the address. In the same way, the transistors 502 and 506 are sequentially turned on the basis of the reset signal bRESET2 and set signal SET2 to detect an address.

Latch circuits 510 and 520 correspond to the latch circuits 22 shown in FIG. 1. The latch circuits 510 and 520 are formed from synchronous circuits controlled by the reset signals bRESET1 and bRESET2 and set signals SET1 and SET2 and latch the decoded output signal RD from the gate circuit 500 with a phase difference therebetween. More specifically, the latch circuit 510 is mainly comprised of a clocked inverter 511 for receiving the decoded output signal RD from the gate circuit 500, and a NOR gate 512 and clocked inverter 513, which form a flip-flop for holding a signal (inverted signal of the decoded output signal RD) from the clocked inverter 511. The reset signal bRESET1 is supplied to the input terminal of an inverter 514. One input terminal of the NOR gate circuit 512 is connected to the output terminal of the inverter 514, and the other input terminal is connected to the output terminal of the clocked inverter 511. The output terminal of the NOR gate 512 corresponds to the output terminal of the latch circuit 510. The output terminal of the NOR gate circuit 512 is connected to the input terminal of the clocked inverter 513. The output terminal of the clocked inverter 513 is connected to the other input terminal of the NOR gate circuit 512. The clocked inverter 511 and clocked inverter 513 are synchronously activated by the set signals SET1 and bSET1.

When the set signals SET1 and bSET1 are activated, the latch circuit 510 receives the decoded output signal RD from the gate circuit 500 and outputs a logic signal corresponding to the decoded output signal RD to a node ND1. When the set signals SET1 and bSET1 are deactivated, the decoded output signal RD received through the clocked inverter 511 is latched by the flip-flop formed from the NOR gate circuit 512 and inverter 513. In addition, the latched data is reset by the reset signal bRESET1.

The latch circuit 520 has the same arrangement as that of the latch circuit 510 except that the reset signals bRESET2 and set signals SET2 and bSET2 are supplied in place of the reset signal bRESET1 and set signals SET1 and bSET1.

In the latch circuits 510 and 520, the decoded output signal RD from the gate circuit 500 is received by the latch circuit 510 on the basis of the set signal SET1 and also received by the latch circuit 520 on the basis of the set signal SET2. This operation is alternately repeated by the latch circuits 510 and 520.

A driving circuit 525 drives the word line WL on the basis of the decoded output signals latched by the latch circuits 510 and 520. The driving circuit 525 comprises a NOR gate 526 for receiving the signals from the latch circuits 510 and 520 and a driving inverter 527 for inverting the output signal from the NOR gate 526. The driving circuit 525 calculates the OR of the decoded output signals latched by the latch circuits 510 and 520 and drives the word line WL.

Figure 6:
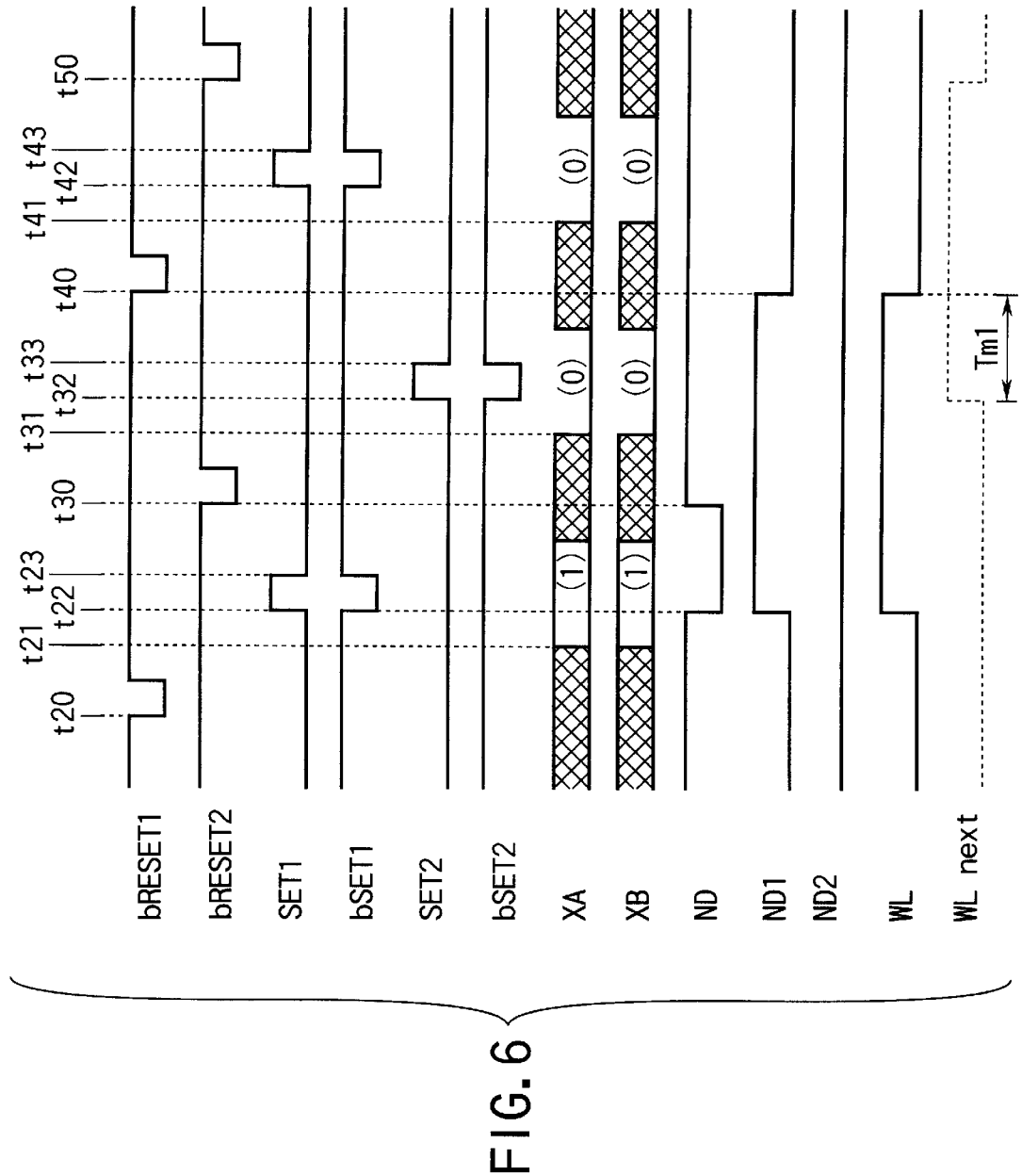
FIG. 6 is a timing chart for explaining the operation of the first specific example of the decoder unit circuit (row decoder)

The operation of the decoder unit circuit shown in FIG. 5 will be described below with reference to the timing chart shown in FIG. 6. Referring to FIG. 6, cross-hatched portions represent regions where the logic of a signal is indefinite (undetermined).

First, the reset signal bRESET1 is activated to reset the gate circuit 500 and latch circuit 510 (t20). The row addresses XA (logic "1") and XB (logic "1") are determined (t21), and the set signals SET1 and bSET1 are activated (t22). Since both the row addresses XA and XB are at logic "1", the potential of the node ND of the gate circuit 500 is grounded (t22), and the signal of logic "1" is output as the decoded output signal RD.

When the set signals SET1 and bSET1 are activated, the decoded output signal RD (logic "1") from the gate circuit 500 is received by the latch circuit 510, and the signal of logic "1" is output to the node ND1 of the latch circuit 510 (t22). The driving circuit 525 receives the decoded output signal (logic "1") at the node ND1 of the latch circuit 510 to set the word line WL at high level (t22). After this, when the set signals SET1 and bSET1 are deactivated (t23), the latch circuit 510 latches the decoded output signal (logic "1") appearing at the node ND1. As a result, the word line WL is kept at a high level.

Next, the reset signal bRESET2 is activated to precharge the node ND and simultaneously reset the latch circuit 520 (t30). The row addresses XA (logic "0") and XB (logic "0") switch (t31), and then, the set signals SET2 and bSET2 are activated (t32). At this time, at least one of the row addresses XA and XB is at logic "0" (both are at logic "0" in the example shown in FIG. 6). For this reason, even when the set signals SET2 and bSET2 are activated, the node ND of the gate circuit 500 is kept at the precharge potential, and the signal of logic "0" is output as the decoded output signal RD.

On the other hand, when the set signals SET2 and bSET2 are activated, the decoded output signal RD (logic "0") is received by the latch circuit 520, and the signal of logic "0" is output to the node ND2 of the latch circuit 520 (t32). In this example, however, since the signal of logic "0" has been output to the node ND in advance, the logic at the node ND2 does not change. After this, when the set signals SET2 and bSET2 are deactivated (t33), the signal of logic "0" is latched by the latch circuit 520 as the decoded output signal.

The above operations will be briefly summarized. On the basis of the reset signal bRESET1 and set signals SET1 and bSET1 the decoded output signal RD for the row addresses XA (logic "1") and XB (logic "1") for selecting the word line WL is latched by the latch circuit 510. On the basis of the reset signal bRESET2 and set signals SET2 and bSET2, the decoded output signal RD for the next row addresses XA (logic "038 ) and XB (logic "0") is latched by the latch circuit 520. Since the decoded output signal RD received by the latch circuit 510 is at logic "1", the driving circuit 525 which receives the decoded output signal outputs the signal of logic "1" to drive the word line WL.

The signal of logic "0" is held by the latch circuit 520 on the basis of the reset signal bRESET2 and set signals SET2 and bSET2. However, in a decoder unit circuit corresponding to, e.g., an adjacent word line WLnext to which the row addresses XA and XB at logic "1" are supplied, the signal of logic "1" is held by the latch circuit 520. For this reason, the word line WLnext is driven, as indicated by a broken line (t32).

Next, the reset signal bRESET1 is activated to precharge the node ND and simultaneously reset the latch circuit 510 (t40). As a consequence, both the latch circuits 510 and 520 supply the signal of logic "0" to the driving circuit 525, and the word line WL changes to low level. When the row addresses XA and XB are switched (t41), and the set signals SET1 and bSET1 are activated (t42), the latch circuit 510 latches the signal of logic "0" as the decoded output signal RD (t43). Next, the gate circuit 500 and latch circuit 520 are reset on the basis of the reset signal bRESET2 (t50). At this timing, the adjacent word line WLnext indicated by the broken line is set at a low level.

As described above, in this decoder unit circuit, the latch circuits 510 and 520 alternately latch the decoded output signal RD in synchronism with transition of the row addresses. That is, after one latch circuit latches the data, the other latch circuit is reset, and this operation is repeated. Hence, even when the row addresses are changed, the decoder unit circuit which is driving the word line maintains the word line in the selected state on the basis of the decoded output signal latched by one of the latch circuits 510 and 520. In addition, in a decoder unit circuit for driving a newly selected word line, the decoded output signal (logic "1") is latched by the other of the latch circuits 510 and 520 to drive the word line. Consequently, while the previously selected word line is kept at a high level, the newly selected word line is set at a high level. As shown in FIG. 6, the word lines are sequentially simultaneously selected in an overlapping period Tm1.

Figure 7:
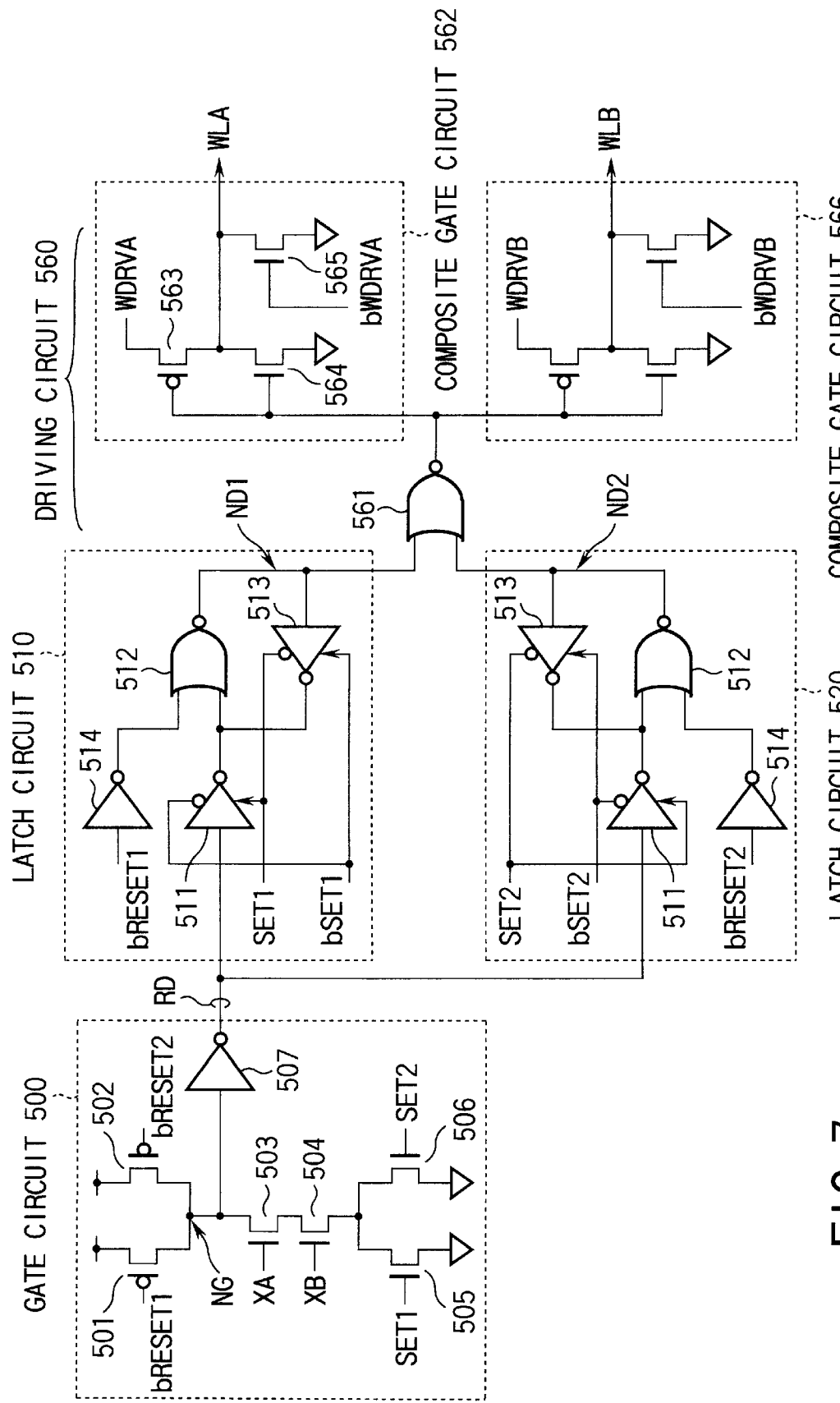
FIG. 7 is a circuit diagram showing the second specific example of the decoder unit circuit (row decoder)

FIG. 7 is a view showing the second specific example of the row decoder 20 and shows a decoder unit circuit as a basic unit.

The decoder unit circuit shown in FIG. 7 can select two word lines WLA and WLB in accordance with matching between the row addresses XA and XB and selectively drives one of the two word lines WLA and WLB on the basis of another address XC. This circuit is constructed by replacing the above-described driving circuit 525 shown in FIG. 5 with a driving circuit 560. The driving circuit 560 comprises a NOR gate 561 for receiving signals from the latch circuits 510 and 520, and composite gates 562 and 566 for receiving a signal from the NOR gate circuit 561 to drive the word lines WLA and WLB.

The composite gate circuit 562 drives the word line WLA when the signal of logic "1" output from the NOR gate circuit 561 is supplied, and a word line driving signal WDRVA is at logic "1". More specifically, the composite gate circuit 562 comprises a PMOS transistor 563 having a source receiving the word line driving signal WDRVA, and NMOS transistors 564 and 565 having sources grounded. The output signal from the NOR gate 561 is commonly supplied to the gates of the transistors 563 and 564. An inverted signal bWDRVA of the word line driving signal WDRVA is supplied to the gate of the transistor 565. The word line WLA is commonly connected to the drains of the PMOS transistor 563 and NMOS transistors 564 and 565. The composite gate 566 also has the same arrangement as described above except that word line driving signals WDRVB and bWDRVB are used instead of the word line driving signals WDRVA and bWDRVA. The word line driving signals WDRVA, bWDRVA, WDRVB, and bWDRVB are obtained by boosting the power supply Vcc.

Figure 8:
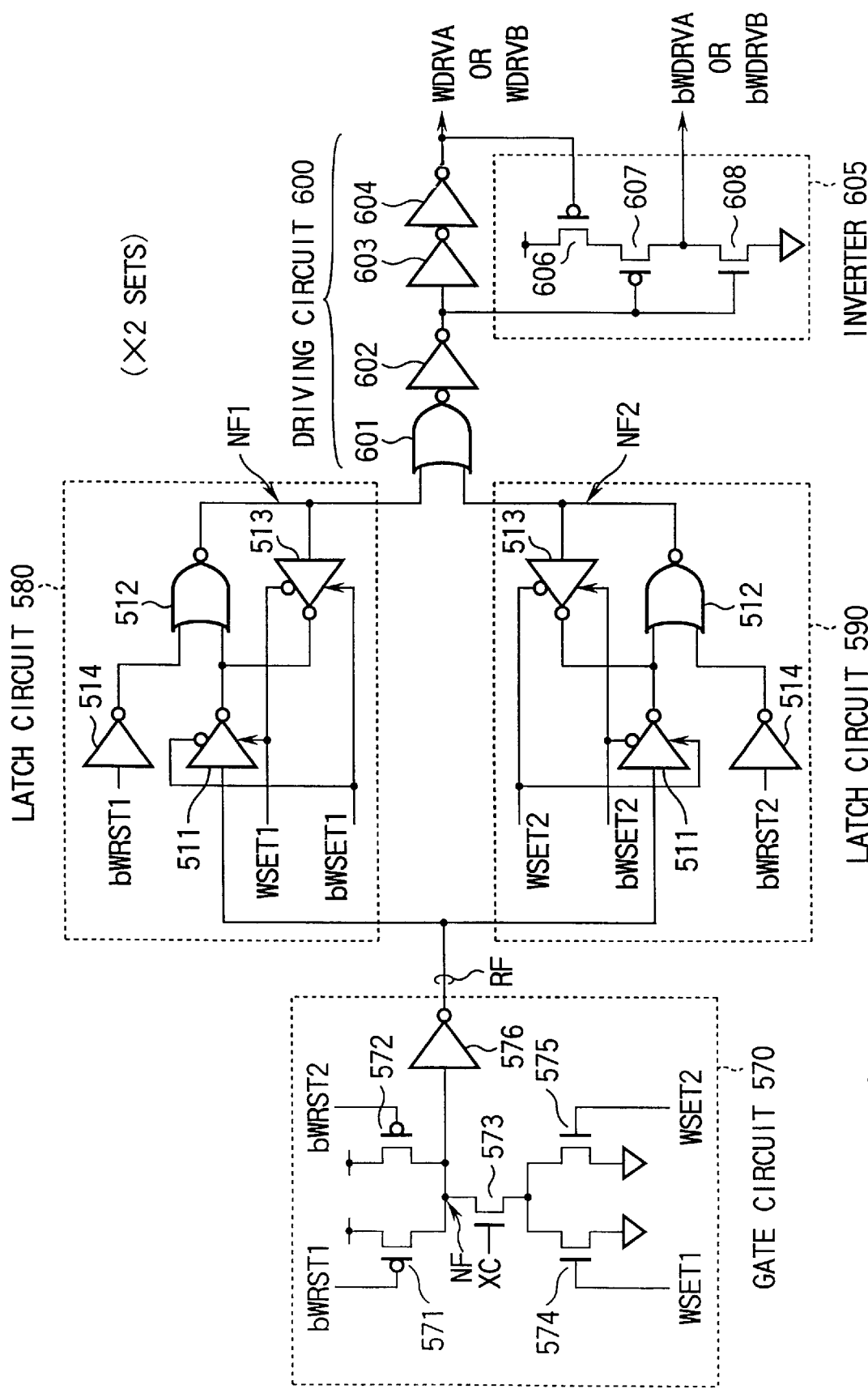
FIG. 8 is a circuit diagram showing a driving signal generation circuit for generating a word line driving signal to be supplied to the circuit shown in FIG. 7.

FIG. 8 shows a specific example of a driving signal generation circuit for generating the word line driving signals WDRVA, bWDRVA, WDRVB, and bWDRVB to be supplied to the driving circuit 560 shown in FIG. 7. Two driving signal generation circuits shown in FIG. 8 are prepared. One (to be referred to as a driving signal generation circuit A hereinafter) of the two driving signal generation circuits receives the address XC and generates the word line driving signals WDRVA and bWDRVA. The other (to be referred to as a driving signal generation circuit B hereinafter) receives the negative phase signal of the address XC and generates the word line driving signals WDRVB and bWDRVB. In the following description, appropriately, the driving signal generation circuits A and B will simply be referred to as "driving signal generation circuits", the word line driving signals WDRVA and WDRVB will be referred to as "word line driving signals WDRV", and the word line driving signals bWDRVA and bWDRVB will be referred to as "word line driving signals bWDRV".

Referring to FIG. 8, a gate circuit 570 decodes the row address XC to generate a decoded signal RF. The gate circuit 570 comprises precharge PMOS transistors 571 and 572 having gates to which reset signals bWRST1 and bWRST2 are supplied, respectively, an address detection NMOS transistor 573 having a gate to which the row address XC is supplied, and ground potential supply NMOS transistors 574 and 575 having gates to which set signals WSET1 and WSET2 are supplied. Latch circuits 580 and 590 have the same arrangements as those of the latch circuits 510 and 520 shown in FIG. 5, respectively, except that the reset signals bWRST1 and bWRST2 and set signals WSET1, bWSET1, WSET2, and bWSET2 are input in place of the reset signals bRESET1 and bRESET2 and set signal SET1, bSET1, SET2, and bSET2.

A driving circuit 600 calculates the OR of signals from the latch circuits 580 and 590 and generates the word line driving signals WDRV and bWDRV. More specifically, the driving circuit 600 comprises a NOR gate 601 having first and second input terminals connected to the output terminals of the latch circuits 580 and 590, respectively, inverters 602 to 604 series-connected to the output terminal of the NOR gate circuit 601, and an inverter 605. The inverter 605 is formed from PMOS transistors 606 and 607 and an NMOS transistor 608 whose current paths are series-connected between the power supply and ground. An output signal from the inverter 602 is commonly supplied to the gates of the transistors 607 and 608. An output signal from the inverter 604, which is delayed from the signal supplied to the gates of the transistors 607 and 608, is supplied to the gate of the transistor 606. With this arrangement, the rise of the word line driving signal bWDRV is delayed to prevent the word line driving signals WDRV and bWDRV from simultaneously changing to logic "1", thereby preventing any erroneous operation of the decoder.

The operation of the decoder unit circuit shown in FIGS. 7 and 8 will be described below. In this decoder unit circuit, the same operation (multiple selection of word lines) as the multiple selection operation of the word lines on the basis of the row addresses XA and XB is also performed when the row address XC is switched.

When the row address XC is at logic "1", in the driving signal generation circuit A having the arrangement shown in FIG. 8, to which the row address XC is supplied, one of the latch circuits 580 and 590 latches the signal of logic "1" and activates the word line driving signals WDRVA and bWDRVA. The composite gate 562 shown in FIG. 7, to which the word line driving signals WDRVA and bWDRVA are supplied, functions as an inverter when an output signal from the NOR gate 561 is supplied. The negative phase signal of the row address XC is fixed at logic "0". The driving signal generation circuit B having the arrangement shown in FIG. 8, to which the negative phase signal is supplied, deactivates the word line driving signals WDRVB and bWDRVB. In this case, the decoder unit circuit shown in FIG. 7 is equivalent to the decoder unit circuit of the first specific example shown in FIG. 5, excluding the composite gate circuit 566. Hence, the decoder unit circuit shown in FIG. 7 operates like the decoder unit circuit shown in FIG. 5 to drive the word line WLA. At this time, the composite gate circuit 566 to which the inactive word line driving signals WDRVB and bWDRVB are supplied holds the word line WLB at low level independently of the output signal from the NOR gate 561.

Conversely, when the negative phase signal of the row address XC is fixed at logic "1", the decoder unit circuit shown in FIG. 7 is equivalent to the decoder unit circuit shown in FIG. 5, excluding the composite gate circuit 562, and drives the word line WLB. At this time, the word line WLA is held at a low level.

Figure 9:
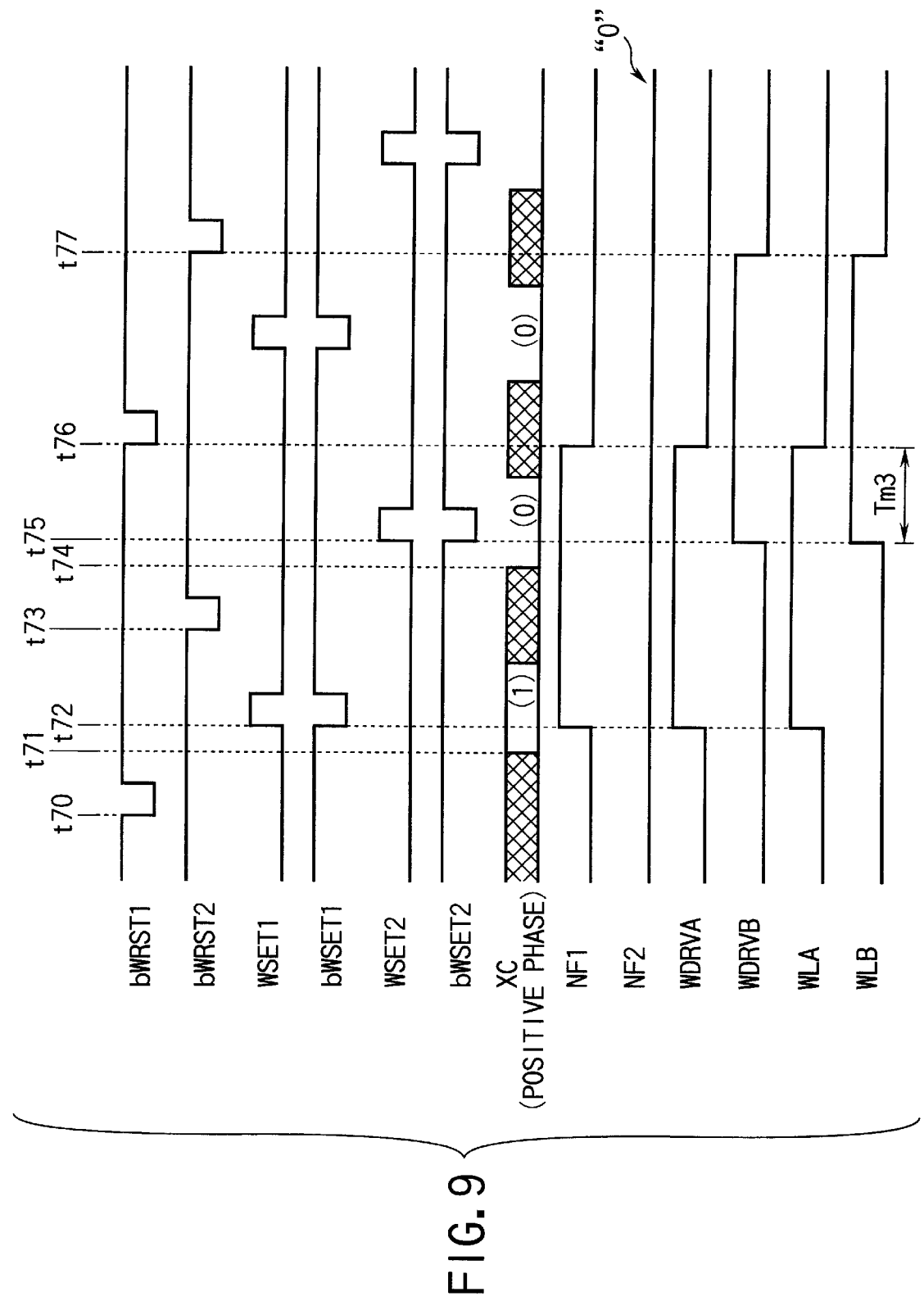
FIG. 9 is a timing chart for explaining the operations of the circuits shown in FIGS. 7 and 8.

The operation when the row address XC is switched will be described next with reference to FIG. 9. Assume that the row addresses XA and XB are fixed. In the driving signal generation circuit A having the arrangement shown in FIG. 8, to which the row address XC is supplied, when the reset signal bWRST1 is activated (t70), a node NF on which the address detection result is reflected by the transistor 571 is precharged, and the latch circuit 580 is reset. Subsequently, the row address XC is set at logic "1" (t71), and the set signals WSET1 and bWSET1 are activated (t72). At this time, the transistor 573 is turned on because the signal of logic "1" is supplied to its gate. For this reason, the node NF is grounded, and the signal of logic "1" is output from an inverter 576 as the decoded output signal RF. The latch circuit 580 latches the decoded output signal RF (logic "1") from the gate circuit 570 on the basis of the set signals WSET1 and bWSET1 and outputs the signal of logic "1" to an output node NF1 (t72). The driving circuit 600 to which this signal is supplied activates the word line driving signals WDRVA and bWDRVA (t72). As a result, the driving circuit 560 shown in FIG. 7, to which the active word line driving signals are supplied, drives the word line WLA (t72). At this time, since the driving signal generation circuit B inactivates the word line driving signals WDRVB and bWDRVB, the word line WLB is not driven. The word line WLA is held in the selected state until the reset signal bWRST1 is activated again (t76).

On the other hand, in the driving signal generation circuit B to which the negative phase signal of the row address XC is supplied, when the reset signal bWRST2 is activated (t73), the node NF is precharged, and the latch circuit 590 is reset. After this, the row address XC is changed to set the negative phase signal at logic "1" (t74), and the set signals WSET2 and bWSET2 are activated (t75). With this operation, the node NF is grounded, and the latch circuit 590 latches the signal of logic "1" and outputs the signal of logic "1" to an output node NF2 (t75). The driving circuit 600 to which this signal is supplied activates the word line driving signals WDRVB and bWDRVB (t75). As a result, the driving circuit 560 shown in FIG. 7, to which the active word line driving signals are supplied, drives the word line WLB (t75). At this time, since the driving signal generation circuit A deactivates the word line driving signals WDRVA and bWDRVA, the word line WLA is not driven. The word line WLB is held in the selected state until the reset signal bWRST" is activated again (t77).

With the above operation, in a period Tm3 from time t75 to time t76, the word line WLB is set at a high level while keeping the word line WLA at a high level. For this reason, even when the row address XC is switched, the word lines are sequentially selected upon a multiple selection period when the two word lines are simultaneously selected.

The above-described decoder unit circuit shown in FIG. 5 has two latch circuits 510 and 520 in correspondence with one word line. However, since the decoder unit circuit shown in FIG. 7 has two latch circuits 510 and 520 in correspondence with two word lines, the number of latch circuits can be halved as compared to the decoder unit circuit shown in FIG. 5. Hence, the area of the latch circuits and gate circuits on the chip can be reduced.

Figure 10:
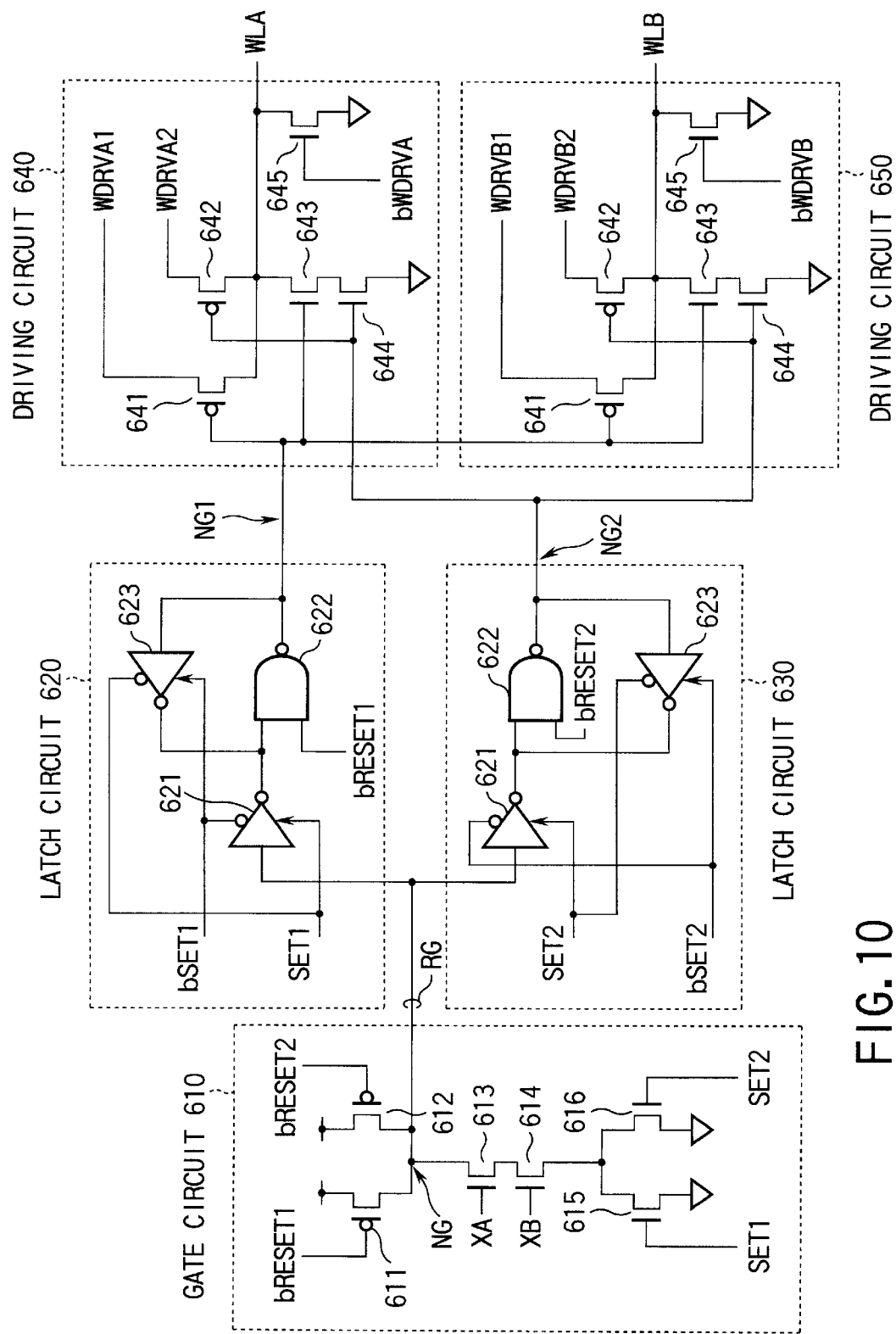
FIG. 10 is a circuit diagram showing the third specific example of the decoder unit circuit (row decoder)

FIG. 10 is a circuit diagram showing the third specific example of the row decoder 20 and shows a decoder unit circuit as a basic unit. One decoder unit circuit is prepared in correspondence with two word lines WLA and WLB. Referring to FIG. 10, a gate circuit 610 decodes the row addresses XA and XB and activates a decoded output signal RG. Latch circuits 620 and 630 sequentially latch the decoded output signal RG from the gate circuit 610 with a phase difference therebetween. Driving circuits 640 and 650 drive the word lines WLA and WLB on the basis of the decoded output signals decoded by the latch circuits 620 and 630, respectively.

The arrangement shown in FIG. 10 will be described in detail. The gate circuit 610 forms a synchronous NAND circuit. Upon detecting that both the row addresses XA and XB are at logic "1", the gate circuit 610 activates the decoded output signal RG and outputs a signal of logic "0". The gate circuit 610 comprises PMOS transistors 611 and 612 for precharging a node NG, ground potential supply NMOS transistors 615 and 616, and an address detection NMOS transistors 613 and 614. The level at the node NG changes depending on the address detection result.

In this gate circuit 610, the transistors 611 and 615 are complementarily turned on based on the reset signal bRESET1 and the set signal SET1, and the addresses are detected by the transistors 613 and 614. More specifically, when the transistor 615 is OFF, the transistor 611 is turned on to precharge the node NG. After the transistor 611 is turned off, the transistor 615 is turned on. When both the row addresses XA and XB are at logic "1", the node NG is grounded through the transistors 613, 614, and 615 to change the decoded output signal RG to logic "0", so the addresses are detected. In a similar manner, the transistors 612 and 616 are complementarily turned on based on the reset signal bRESET2 and the set signal SET2 to alternately detect addresses.

The latch circuit 620 comprises a tristate inverter 621 to which the decoded output signal RG from the gate circuit 610 is supplied, a NAND gate 622, and a tristate inverter 623. The NAND gate 622 and tristate inverter 623 form a flip-flop for holding a signal (inverted signal of the decoded output signal RG) from the tristate inverter 621. The output impedances of the inverters 621 and 623 are complementarily controlled by the set signals SET1 and bSET1. The reset signal bRESET1 is supplied to the NAND gate 622.

In this latch circuit 620, when the set signals SET1 and bSET1 are activated, the decoded output signal RG from the gate circuit 610 is supplied to the NAND gate 622 and inverter 623 through the inverter 621. When the set signals SET1 and bSET1 are deactivated, the output terminal of the inverter 623 is set at a low impedance. As a result, the decoded output signal RG is latched by the flip-flop formed by the NAND gate 622 and inverter 623. The latched data is reset by the reset signal bRESET1.

The latch circuit 630 has the same arrangement as that of the latch circuit 620 except that the reset signal bRESET2 and set signals SET2 and bSET2 are used in place of the reset signal bRESET1 and set signals SET1 and bSET1. When the set signals SET2 and bSET2 are activated, the latch circuit 630 receives the decoded output signal RG from the gate circuit 610. When the set signals SET2 and bSET2 are deactivated, the latch circuit 630 latches the received decoded output signal RG. The latched data is reset by the reset signal bRESET2.

The driving circuit 640 is formed from a composite gate circuit. When the signal from the latch circuit 620 is at logic "0", and the word line driving signal WDRVA1 is at logic "1", or when the signal from the latch circuit 630 is at logic "0", and the word line driving signal WDRVA2 is at logic "1", the driving circuit 640 drives the word line WL.

More specifically, the driving circuit 640 comprises PMOS transistors 641 and 642, NMOS transistors 643 and 644, and an NMOS transistor 645. The PMOS transistors 641 and 642 have sources to which word line driving signals WDRVA1 and WDRVA2 are supplied and drains commonly connected to the word line WLA. The NMOS transistors 643 and 644 are connected in series between the word line WLA and ground. The NMOS transistor 645 has a drain connected to the word line WLA and a source grounded. The output signal from the latch circuit 620 is supplied to the gates of the transistors 641 and 643, and the output signal from the latch circuit 630 is supplied to the gates of the transistors 642 and 644. The word line driving signal bWDRVA generated by the NOR of the word line driving signals WDRVA1 and WDRVA2 is supplied to the gate of the transistor 645.

The driving circuit 650 has the same arrangement as that of the driving circuit 640 to drive the word line WLB except that the word line driving signals WDRVB1, WDRVB2, and bWDRVB are used in place of the word line driving signals WDRVA1, WDRVA2, and bWDRVA. The word line driving signal bWDRVB is generated by the NOR of the word line driving signals WDRVB1 and WDRVB2.

Figure 11:
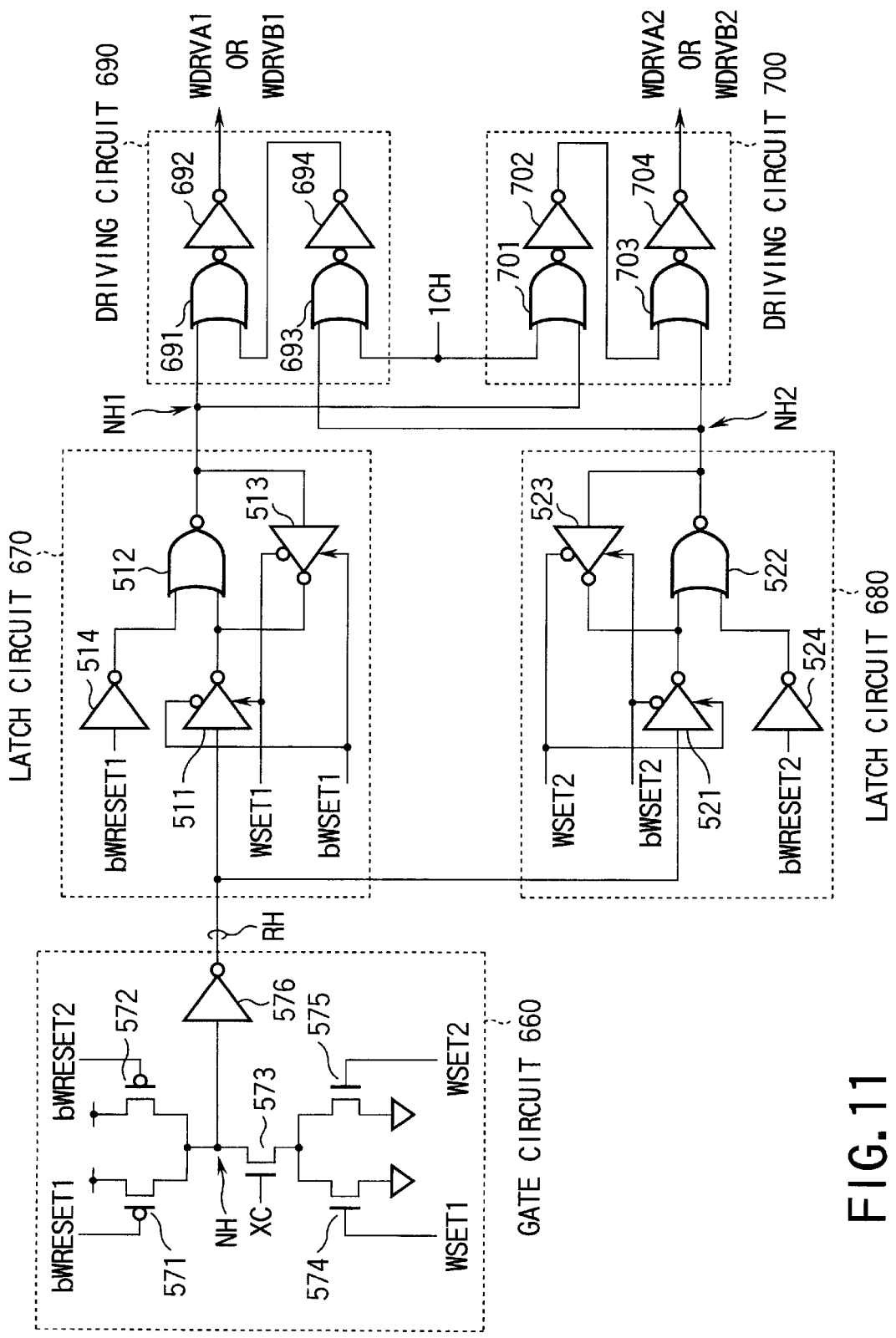
FIG. 11 is a circuit diagram showing a driving signal generation circuit for generating a word line driving signal to be supplied to the circuit shown in FIG. 10.

FIG. 11 is a circuit diagram showing the specific example of a driving signal generation circuit for generating the word line driving signals WDRVA1, WDRVA2, and bWDRVA, and WDRVB1, WDRVB2, and bWDRVB. Two driving signal generation circuits are prepared. One (to be referred to as a "driving signal generation circuit A" hereinafter) of the two driving signal generation circuits generates the word line driving signals WDRVA1, WDRVA2, and bWDRVA in accordance with the row address XC. The other (to be referred to as a "driving signal generation circuit B" hereinafter) generates the word line driving signals WDRVB1, WDRVB2, and bWDRVB in accordance with the negative phase signal of the row address XC. The word line driving signal bWDRVA is generated by the NOR of the word line driving signals WDRVA1 and WDRVA2. The word line driving signal bWDRVB is generated by the NOR of the word line driving signals WDRVB1 and WDRVB2.

Referring to FIG. 11, a gate circuit 660 and latch circuits 670 and 680 have the same arrangements as those of the gate circuit 570 and latch circuits 580 and 590 shown in FIG. 8 except that reset signals bWRESET1 and bWRESET2 are input instead of the reset signals WRST1 and WRST2.

When a control signal ICH (to be described later) is at logic "0", driving circuits 690 and 700 output signals from the latch circuits 670 and 680 as the word line driving signals WDRVA1/WDRVB1 and WDRVA2/WDRVB2, respectively. When the control signal ICH is at logic "1", the driving circuits 690 and 700 output the OR signals of the output signals from the latch circuits 670 and 680 as the word line driving signals WDRVA1/WDRVB1 and WDRVA2/WDRVB2, respectively.

More specifically, the driving circuit 690 comprises a NOR gate 691 having one input terminal to which a signal from the latch circuit 670 is supplied, an inverter 692 for inverting the output signal from the NOR gate 691 and outputting the word line driving signals WDRVA1/WDRVB1, a NAND gate 693 for inputting a signal from the latch circuit 680 and the control signal ICH, and an inverter 694 for inverting the output signal from the NAND gate 693 and supplying the signal to the other input terminal of the NOR gate 691.

The driving circuit 700 comprises a NOR gate 703 having one input terminal to which an output signal from the latch circuit 680 is supplied, an inverter 704 for inverting the output signal from the NOR gate 703, a NAND gate 701 to which the output signal from the latch circuit 670 and the control signal ICH are supplied, and an inverter 702 for inverting the output signal from the NAND gate 701 and supplying the signal to the other input terminal of the NOR gate 703.

Figure 12:
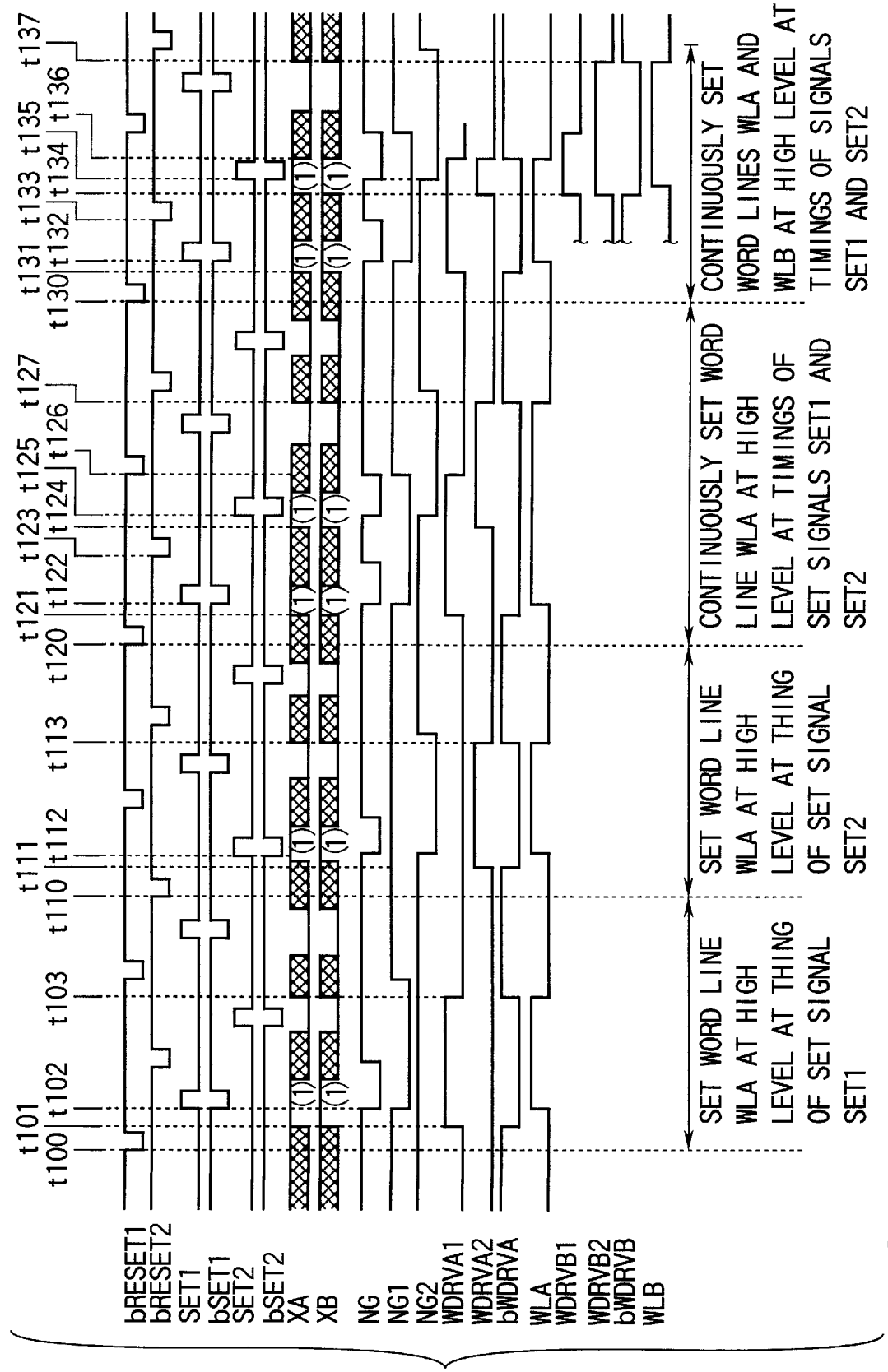
FIG. 12 is a timing chart for explaining the operation of the circuit shown in FIG. 10.

The operation of the decoder unit circuit shown in FIG. 10 will be described below with reference to the timing chart shown in FIG. 12. Referring to FIG. 12, the word line driving signals WDRVA1, WDRVA2, bWDRVA, WDRVB1, WDRVB2, and bWDRVB will be described in association with the operation of the driving signal generation circuit shown in FIG. 11.

A case wherein the word line WLA is set at high level at the timing of the set signal SET1 will be described. First, the reset signal bRESET1 is activated to precharge the node NG of the gate circuit 610 (t100). The addresses XA (logic "1") and XB (logic "1") are determined (t101). At this time, the word line driving signals WDRVA1 and bWDRVA are activated by the driving signal generation circuit shown in FIG. 11. Subsequently, the set signals SET1 and bSET1 are activated (t102). The decoded output signal RG (logic "0") from the gate circuit 610 is latched by the latch circuit 620, and the signal of logic "0" is output to an output node NG1. The signal (logic "0") from the latch circuit 620 is supplied to the gates of the transistors 641 and 643 of the driving circuit 640 to turn on the transistor 641 and turn off the transistor 643. With this operation, the driving circuit 640 outputs the word line driving signal WDRVA1 (logic "1") supplied to the source of the transistor 641 to drive the word line WLA. The word line WLA is set at a low level when the word line driving signal WDRVA1 is deactivated (t103).

Next, a case wherein the word line WLA is set at a high level at the timing of the set signal SET2 will be described. The reset signal bRESET2 is activated (t110), the addresses XA (logic "1") and XB (logic "1") are determined (t111), and the set signals SET2 and bSET2 are activated (t112). The decoded output signal RG (logic "0") is latched by the latch circuit 630 and output to an output node NG2. The driving circuit 650 to which the decoded output signal RG is supplied drives the word line WLA in accordance with the word line driving signal WDRVA2 (logic "1"). The word line WLA is set at low level when the word line driving signal WDRVA2 is deactivated (t113).

Next, a case wherein the word line WLA is continuously set at high level at the timings of the set signals SET1 and SET2 will be described. The reset signal bRESET1 is activated (t120) to precharge the node NG of the gate circuit 610. The addresses XA (logic "1") and XB (logic "1") are determined (t121). At this time, the word line driving signal WDRVA1 is activated for a predetermined period (t121 to t126). The set signals SET1 and bSET1 are activated (t122), and the decoded output signal RG (logic "0") from the gate circuit 610 is latched by the latch circuit 620. The latch circuit 620 outputs the signal of logic "0" to the output node NG1. The driving circuit 640 outputs the word line driving signal WDRVA1 (logic "1") in accordance with the logic level at the output node NG1 to drive the word line WLA.

Subsequently, the reset signal bRESET2 is activated (t123), and the same addresses XA (logic "1") and XB (logic "1") are determined (t124). At this time, the word line driving signal. WDRVA2 is activated. The set signals SET2 and bSET2 are activated (t125), and the decoded output signal RG (logic "0") is latched by the latch circuit 630. The latch circuit 630 outputs the signal of logic "0" to the output node NG2. The signal (logic "0") from the latch circuit 630 is supplied to the gates of the transistors 642 and 644 of the driving circuit 640 to turn on the transistor 642 and turn off the transistor 644. The driving circuit 640 outputs the word line driving signal WDRVA2 (logic "1") supplied to the source of the transistor 642. Hence, the word line WLA is continuously set at a high level in accordance with the word line driving signal WDRVA2 even after the word line driving signal WDRVA1 is deactivated. The word line WLA is set at a low level when the word line driving signal WDRVA2 is deactivated (t126).

In the above operations, the decoder unit circuit constituting the row decoder 20 sequentially sets the word line WLA at high level with a multiple selection period, as in the above-described first and second specific examples.

Next, a case wherein the word lines WLA and WLB are continuously set at high level at the timings of the set signals SET1 and SET2 will be described. The word lines WLA and WLB are switched by the address XC. First, the reset signal bRESET1 is activated (t130) to precharge the node NG of the gate circuit 610. The addresses XA (logic "1"), XB (logic "1"), and XC (not shown) (logic "1") are determined (t131). At this time, the word line driving signal WDRVA1 is activated. Next, the set signals SET1 and bSET1 are activated (t132), and the decoded output signal RG (logic "0") from the gate circuit 610 is latched by the latch circuit 620. The latch circuit 620 outputs the signal of logic "0" to the output node NG1. The driving circuit 640 outputs the word line driving signal WDRVA1 (logic "1") in accordance with the logic level of the output node NG1 to drive the word line WLA. The word line WLA is set at a low level when the word line driving signals WDRVA1 and WDRVA2 are deactivated (t136).

Subsequently, the reset signal bRESET2 is activated (t133) to precharge the node NG of the gate circuit 610. After this, the address XC (not shown) (logic "0") is determined while keeping the addresses XA (logic "1") and XB (logic "1") unchanged (t134). At this time, the word line driving signal WDRVB2 is activated. The set signals SET2 and bSET2 are activated (t135), and the decoded output signal RG (logic "0") is latched by the latch circuit 630. The latch circuit 630 outputs the signal of logic "0" to the output node NG2. The output signal (logic "0") from the latch circuit 630 is supplied to the gates of the transistors 642 and 644 of the driving circuit 650 to turn on the transistor 642 and turn off the transistor 644. The driving circuit 650 drives the word line WLB in accordance with the word line driving signal WDRVB2 (logic "1") supplied to the source of the transistor 642. The word line WLB is set at a low level when the word line driving signal WDRVB2 is deactivated (t137). Hence, the word lines WLA and WLB are sequentially set at high level upon the multiple selection period (t134 to t135).

Figure 13:
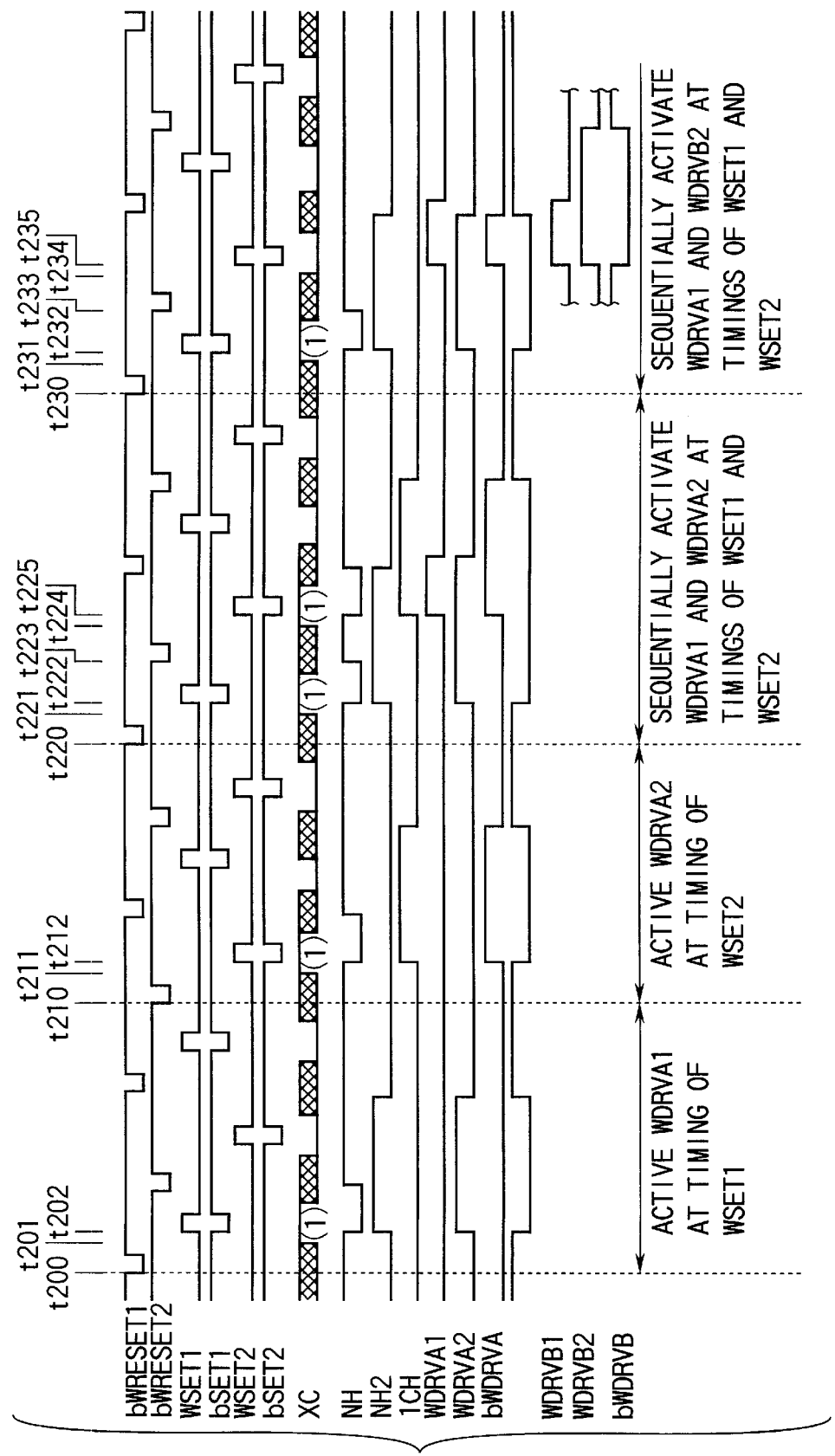
FIG. 13 is a timing chart for explaining the operation of the circuit shown in FIG. 11.

The operation of the driving signal generation circuit shown in FIG. 11 will be described next with reference to the timing chart shown in FIG. 13. The driving signal generation circuit decodes the address XC and selects the word lines WLA and WLB. The driving signal generation circuit generates the above-described word line driving signals WDRVA1, WDRVA2, and bWDRVA, and WDRVB1, WDRVB2, and bWDRVB.

The operation of the circuit shown in FIG. 11 will be described below. First, a case wherein the word line driving signal WDRVA1 is activated at the timing of the set signal WSET1 will be described. The reset signal bWRESET1 is activated (t200) to precharge a node NH of the gate circuit 660. The address XC (logic "1") is determined (t201), and the set signals WSET1 and bWSET1 are activated (t202). A decoded output signal RH (logic "1") is latched by the latch circuit 670, and an output node NH1 of the latch circuit 670 is set at logic "1". When the output node NH1 is at logic "1", the driving circuit 690 activates the word line driving signal WDRVA1 and outputs the signal of logic "1".

Next, a case wherein the word line driving signal WDRVA2 is activated at the timing of the set signal WSET2 will be described. The reset signal bWRESET2 is activated (t210). The address XC (logic "1") is determined (t211), and the set signals WSET2 and bWSET2 are activated (t212). The decoded output signal RH (logic "1") is latched by the latch circuit 680, and an output node NH2 of the latch circuit 680 is set at logic "1". When the output node NH2 is at logic "1", the driving circuit 700 activates the word line driving signal WDRVA2 and outputs the signal of logic "1".

Next, a case wherein the word line driving signals WDRVA1 and WDRVA2 are continuously sequentially activated at the timings of the set signals WSET1 and WSET2 will be described. First, the reset signal bWRESET1 is activated (t220). The address XC (logic "1") is determined (t221). The set signals WSET1 and bWSET1 are activated (t222). The decoded output signal RH (logic "1") from the gate circuit 660 is latched by the latch circuit 670. The latch circuit 670 outputs the signal of logic "1" to the output node NH1. When the output node NH1 is at logic "1", the driving circuit 690 activates the word line driving signal WDRVA1.

Subsequently, the reset signal bWRESET2 is activated (t223). The address XC (logic "1") is determined (t224). The set signals WSET2 and bWSET2 are activated (t225). The decoded output signal RH (logic "1") is latched by the latch circuit 680. The latch circuit 680 outputs the signal of logic "1" to the output node NH2. When the output node NH2 is at logic "1", the driving circuit 700 activates the word line driving signal WDRVA2. With this operation, the word line driving signals WDRVA1 and WDRVA2 are continuously sequentially activated.

Next, a case wherein the word line driving signals WDRVA1 and WDRVB2 are continuously sequentially activated at the timings of the set signals WSET1 and WSET2 will be described. In this case, the address XC is switched. First, of the two driving signal generation circuits, in the driving signal generation circuit A for receiving the address XC, the reset signal bRESET1 is activated (t230), and the address XC (logic "1") is determined (t231). The set signals WSET1 and bWSET1 are activated (t232), and the decoded output signal RH (logic "1") is latched by the latch circuit 670. The latch circuit 670 outputs the signal of logic "1" to the output node NH1. The driving circuit 690 activates the word line driving signal WDRVA1 when the output node NH1 is at logic "1".

Subsequently, in the other driving signal generation circuit B, the reset signal bRESET2 is activated (t233), and the address XC (the negative phase signal is at logic "1") is determined (t234). The set signals WSET2 and bWSET2 are activated (t235), and the decoded output signal RH (logic "1") is latched by the latch circuit 680. The latch circuit 680 outputs the signal of logic "1" to the output node NH2. The driving circuit 700 activates the word line driving signal WDRVB2 when the output node NH2 is at logic "1". Hence, the word line driving signals WDRVA1 and WDRVB2 are continuously sequentially activated. The word line driving signals generated by the driving signal generation circuits A and B are supplied to the decoder unit circuit shown in FIG. 10 and used to drive word lines.

The control signal ICH will be described. When the addresses XA and XB do not change (the same addresses XA and XB continue), both the latch circuits 620 and 630 shown in FIG. 10 latch a signal of logic "0", and both the transistors 641 and 642 are turned on. In this case, the output terminals of the driving circuits 690 and 700 shown in FIG. 11 are connected through the transistors 641 and 642. When the word line driving signals WDRVA1 and WDRVA2 are at different logic levels, the power supply and ground are short-circuited. Hence, when the addresses XA and XB do not change, the control signal ICH is activated to commonly supply the output signals from the latch circuits 670 and 680 to the driving circuits 690 and 700. With this arrangement, the word line driving signals WDRVA1 and WDRVA2 can be set at the same logic level, and the short circuit can be avoided.

In the second specific example of the decoder unit circuit shown in FIG. 7, when the address XC is switched together with the addresses XA and XB, multiple word line selection based on the addresses XA and XB and multiple word line selection based on the address XC are simultaneously performed. As a consequence, the word lines WLA and WLB may be simultaneously selected by two decoder unit circuits, and four word lines may be simultaneously selected. For this reason, simultaneous switching of the addresses XA, XB, and XC is inhibited for practical use.

To the contrary, in the third specific example of the decoder unit circuit shown in FIG. 10, the addresses, XA, XB, and XC can be simultaneously switched to allow perfect random access. More specifically, in this decoder unit circuit, the latch circuit 620 shown in FIG. 10 determines whether the word line driving signals WDRVA1 and WDRVB1 are to be output to the word lines WLA and WLB, respectively, and the latch circuit 630 determines whether the word line driving signals WDRVA2 and WDRVB2 are to be output to the word lines WLA and WLB, respectively. However, the driving signal generation circuit shown in FIG. 11 simultaneously activates neither the word line driving signals WDRVA1 and WDRVB1 nor the word line driving signals WDRVA2 and WDRVB2. Hence, even when the addresses XA, XB, and XC are simultaneously switched, one decoder unit circuit does not simultaneously select the word lines WLA and WLB. A plurality of word lines can be sequentially selected by setting the multiple selection period for only two word lines, so perfect random access can be performed.

In the driving circuits 640 and 650 shown in FIG. 10, the word line driving signals WDRVA1 and WDRVB1 are supplied to the source of the PMOS transistor 641 of the NAND circuit, and the word line driving signals WDRVA2 and WDRVB2 are supplied to the source of the PMOS transistor 642. For this reason, the area can be reduced as compared to a case wherein the driving circuits 640 and 650 are formed from CMOS inverter circuits.

The second embodiment of the present invention will be described below with reference to FIG. 14.

In the first embodiment, two sense amplifiers 50*a* and 50*b* are arranged in correspondence with the two memory cell arrays 10A and 10B. In the second embodiment, a sense amplifier 50*b* is shared by a plurality of memory cell arrays 10A to 10D belonging to one bank BK, and the sense amplifier 50*b* is connected to any one of the memory cell arrays in the bank BK.

Figure 14:
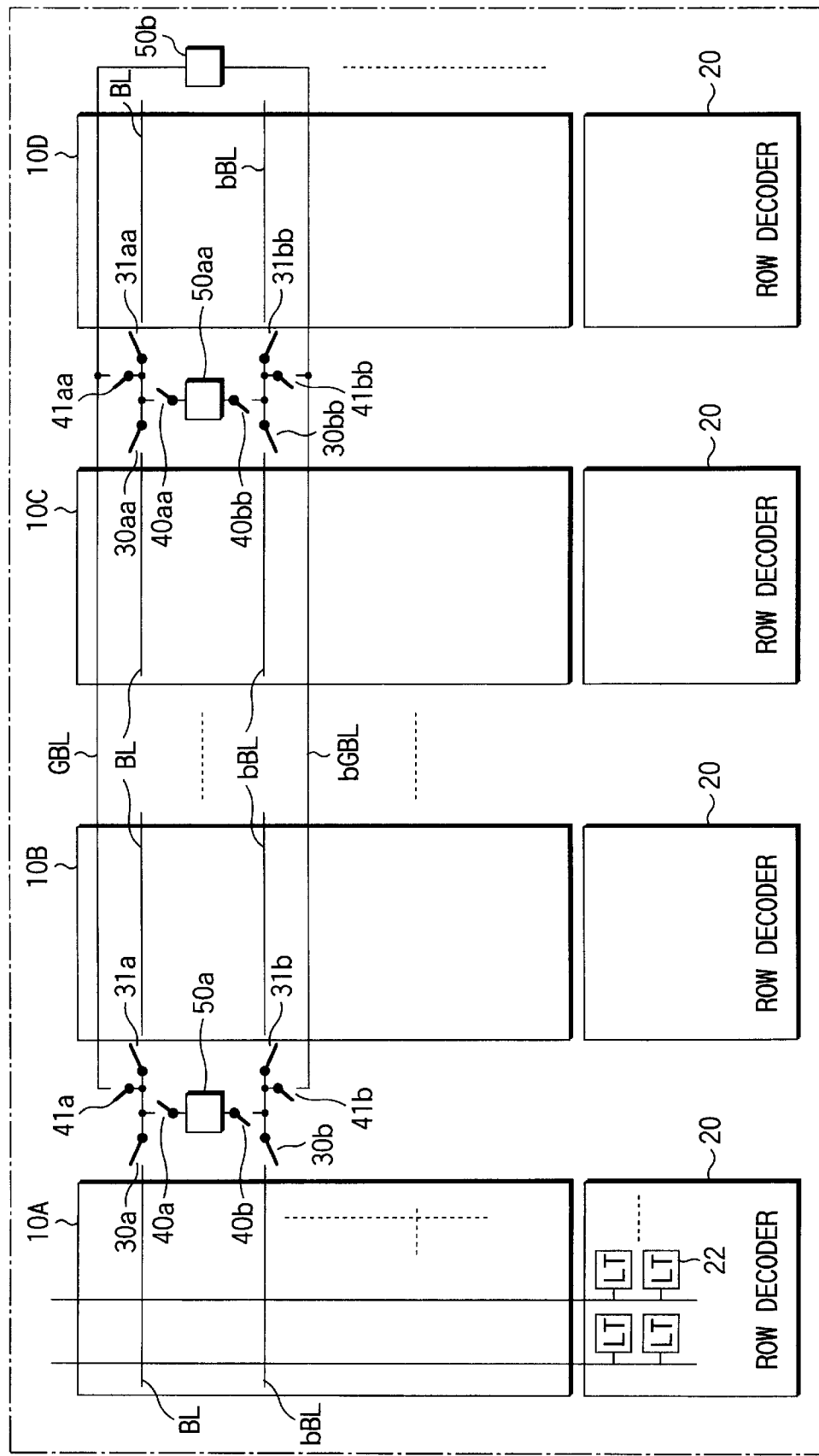
FIG. 14 is a block diagram showing a semiconductor memory device according to the second embodiment of the present invention.

More specifically, referring to FIG. 14, a sense amplifier 50*a* is shared by memory cell arrays 10A and 10B and connected to the memory cell array 10A or 10B through switches (transistors) 30*a* and 30*b* or 31*a* and 31*b* and switches 40*a* and 40*b*. A sense amplifier 50*aa* is shared by memory cell arrays 10C and 10D and connected to the memory cell array 10C or 10D through switches 30*aa* and 30*bb* or 31*aa* and 31*bb* and switches 40*aa* and 40*bb*.

Common bit lines extend parallel to bit lines BL and bBL of each memory cell array. The sense amplifier 50*b* is connected to the terminals of the common bit lines GBL and bGBL. The sense amplifier 50*b* is connected to the memory cell array 10C or 10D through the switches 30*aa* and 30*bb* or 31*aa* and 31*bb* and switches 41*aa* and 41*bb*. The sense amplifier 50*a* is also connected to the memory cell array 10C or 10D through the switches 30*a*, 30*b*, 31*a*, 31*b*, 41*a*, and 41*b*.

The operation of the second embodiment will be described below.

When one bank is formed from a plurality of memory cell arrays, the memory cell arrays are not simultaneously read-accessed, and only one memory cell array is read-accessed. The switches 41*a* and 41*b* or 41*aa* and 41*bb* are selectively turned on to connect the sense amplifier 50*b* to a memory cell array to be read-accessed. For example, when the memory cell array 10A is to be read-accessed, the switches 41*a* and 41*b* are turned on, and the switches 41*aa* and 41*bb* are turned off. Hence, the memory cell array 10A in FIG. 14 is equivalent to that of the first embodiment shown in FIG. 1 and performs as in the first embodiment.

According to the second embodiment, the scale of the sense amplifier can be reduced relative to the scale of the memory cell array.

The third embodiment of the present invention will be described below with reference to FIG. 15.

In the first embodiment shown in FIG. 1, since the memory cell arrays 10A and 10B share the sense amplifiers 50*a* and 50*b*, the transistors 30*a* and 30*b* and transistors 31*a* and 31*b* are arranged. That is, two switches are connected in series between a bit line and a sense amplifier. In the third embodiment, a sense amplifier 50*a* is connected to bit lines BL and bBL of a memory cell array 10A through switches 40*a*1 and 40*b*1, respectively, and to bit lines BL and bBL of a memory cell array 10B through switches 41*a*1 and 41*b*1, respectively. A sense amplifier 50*b* is connected to the bit lines BL and bBL of the memory cell array 10A through switches 40*a*2 and 40*b*2, respectively, and to the bit lines BL and bBL of the memory cell array 10B through switches 41*a*2 and 41*b*2, respectively. That is, a bit line and a sense amplifier are connected through one switch.

Figure 15:
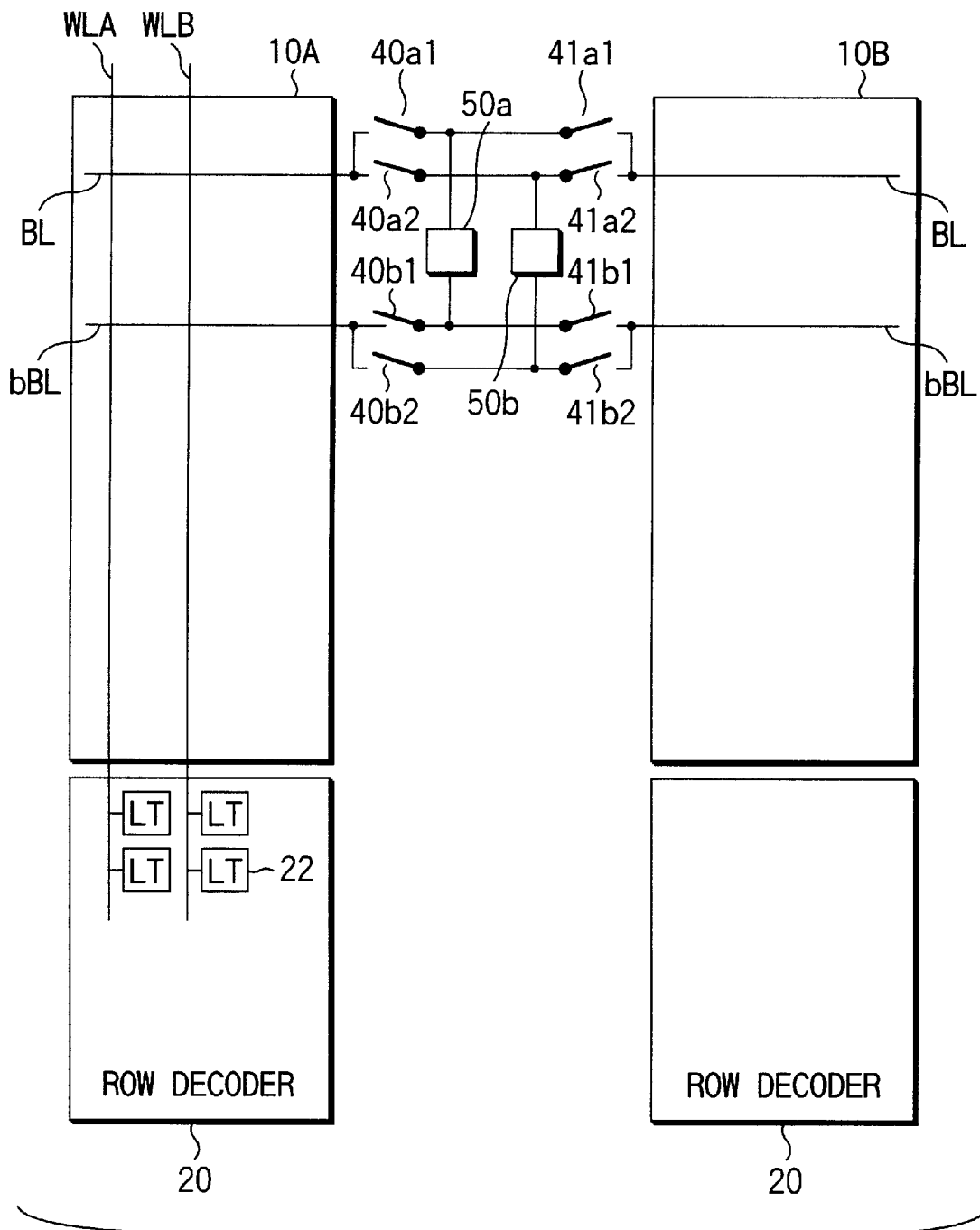
FIG. 15 is a block diagram showing a semiconductor memory device according to the third embodiment of the present invention.
Figure 16:
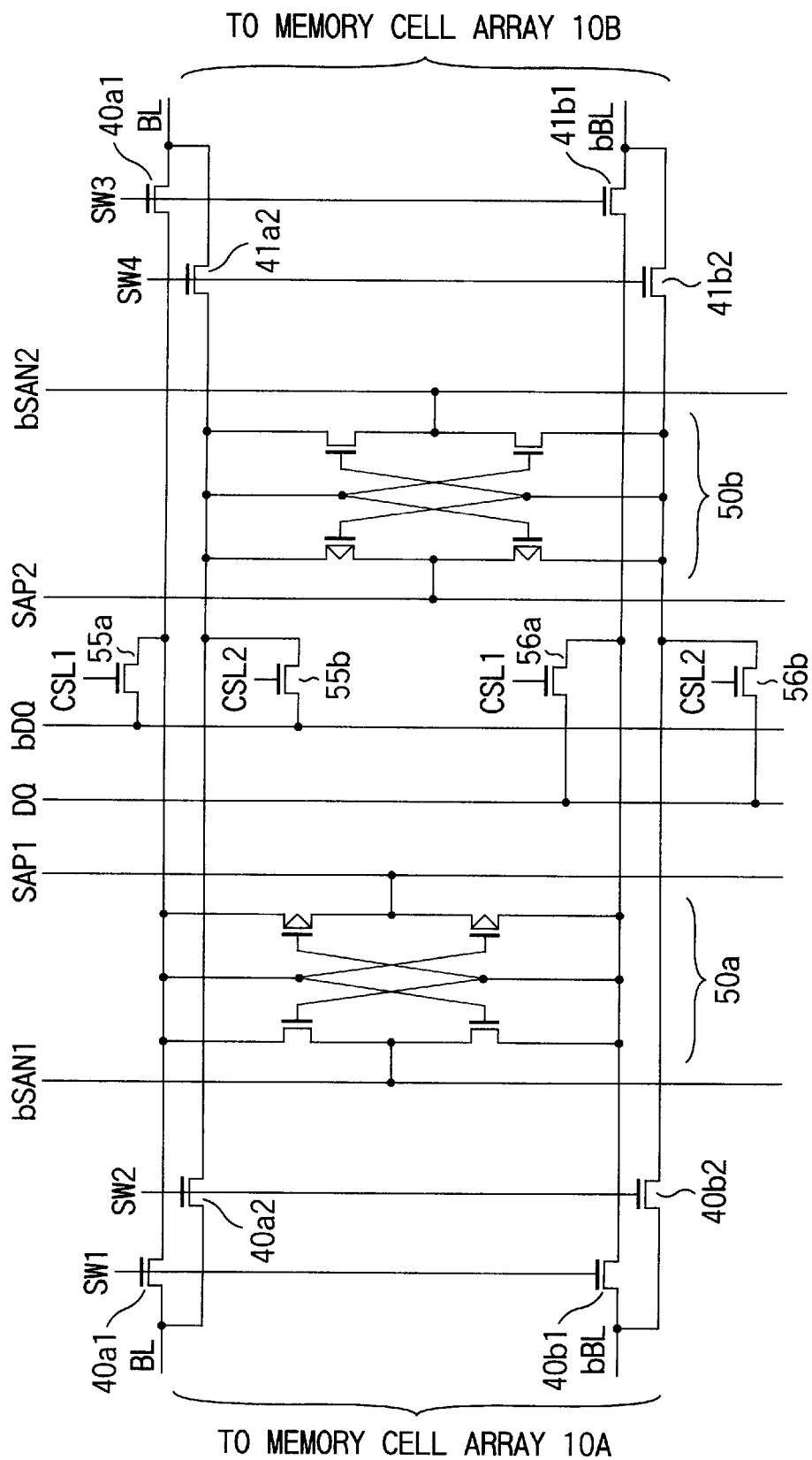
FIG. 16 is a circuit diagram showing the arrangement of sense amplifiers shown in FIG. 15.

FIG. 16 shows the arrangement around the sense amplifiers shown in FIG. 15. The same reference numerals as in FIG. 2 denote the same elements in FIG. 16. As shown in FIG. 16, the sense amplifier 50*a* formed from a flip-flop is connected to the bit lines BL and bBL of the memory cell array 10A or 10B through the transistors 40*a*1 and 40*b*1 or transistors 41*a*1 and 41*b*1. Similarly, the sense amplifier 50*b* formed from a flip-flop is connected to the bit lines BL and bBL of the memory cell array 10A or 10B through the transistors 40*a*2 and 40*b*2 or transistors 41*a*2 and 41*b*2.

The operation of the third embodiment will be described below by exemplifying a data read access to the memory cell array 10A. Referring to FIGS. 15 and 16, the switches 41*a*1 and 41*b*1 and switches 41*a*2 and 41*b*2 are turned off. The memory cell array 10A is equivalent to that shown in FIG. 1 in which the transistors 30*a* and 30*b* are turned on, and the transistors 31*a* and 31*b* are turned off. The switches 40*a*1 and 40*b*1 and switches 40*a*2 and 40*b*2 operate like the switches 40*a* and 40*b* and switches 41*a* and 41*b* in FIG. 1, respectively.

In the third embodiment, only one switch pair is present between a sense amplifier and a bit line. For this reason, the electrical resistance between the sense amplifier and bit line can be decreased as compared to the first embodiment in which two switch pairs are inserted between a sense amplifier and a bit line. Hence, according to the third embodiment, a signal can be transmitted to the sense amplifier at a high speed.

In addition, according to the third embodiment, only one switch pair is present between a sense amplifier and a bit line, and the restriction on layout of transistors forming switch pairs can be relaxed as compared to the first embodiment. Hence, the channel width of a transistor can be made larger than that in the first embodiment, and the current driving capability of the transistor can be improved to allow a high-speed operation.

The fourth embodiment of the present invention will be described next with reference to FIG. 17. In the above-described first embodiment, the sense amplifiers 50a and 50b are arranged between the memory cell arrays 10A and 10B which are adjacent to each other. In the fourth embodiment, however, sense amplifiers 50a and 50b are arranged on both sides of bit lines through a memory cell array.

Figure 17:
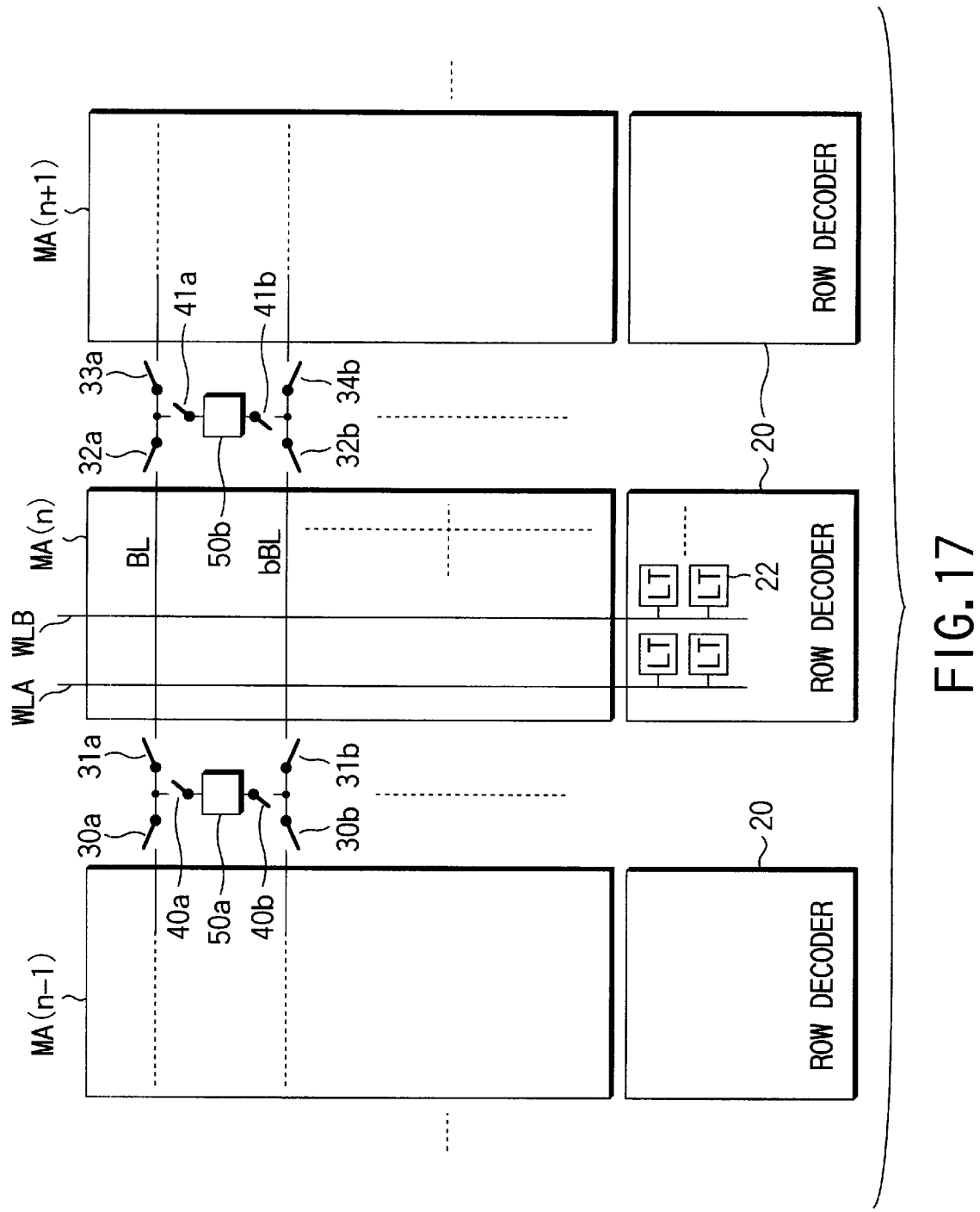
FIG. 17 is a block diagram showing a semiconductor memory device according to the fourth embodiment of the present invention.

More specifically, as shown in FIG. 17, in association with a memory cell array MA(n), the sense amplifier 50a is arranged on the left side of bit lines BL and bBL through switches 31a and 31b, and the sense amplifier 50b is arranged on the right side of the bit lines BL and bBL through switches 32a and 32b. The sense amplifier 50a is shared, through the switches 30a and 30b and switches 31a and 31b, by memory cell arrays MA(n−1) and MA(n) arranged on the left and right sides of the sense amplifier 50a. The sense amplifier 50b is shared, through the switches 32a and 32b and switches 33a and 33b, by memory cell arrays MA(n) and MA(n+1) arranged on the left and right sides of the sense amplifier 50b. That is, the sense amplifiers 50a and 50b are alternately arranged between the memory cell arrays.

The operation of the fourth embodiment will be described by exemplifying a data read access to the memory cell array MA(n). First, the switches 31a and 31b and switches 32a and 32b are turned on, and the switches 30a and 30b and switches 33a and 33b are turned off. In this case, the memory cell array MA(n) is equivalent to the memory cell array 10A shown in FIG. 1 in which the switches 30a and 30b are turned on, and switches 31a and 31b are turned off, and operates as in FIG. 1.

According to the fourth embodiment, since the sense amplifiers are distributed, the peak value of noise during operation of adjacent sense amplifiers can be suppressed, and erroneous operation of the sense amplifiers can be prevented.

The fifth embodiment of the present invention will be described next with reference to FIG. 18. In the above embodiments, each of the sense amplifiers 50a and 50b is formed by cross-connecting a pair of CMOS inverters. In the fifth embodiment, PMOS transistors TNLa and TNLb whose gates and drains are cross-connected are inserted between switches 30a and 30b and switches 31a and 31b on bit lines BL and bBL. A predetermined control signal SAP which is activated in re-storage is supplied to the sources of the PMOS transistors TNLa and TNLb. Two sense amplifiers 50aa and 50bb have no pull-up transistors, and the PMOS transistors TNLa and TNLb are used as pull-up transistors.

The operation of the fifth embodiment will be described below.

When data from a memory cell is to be amplified by the sense amplifier 50aa and transferred to data lines DQ and bDQ, the control signal SAP is deactivated, and in this state, the data from the memory cell is received by the sense amplifier 50aa. Next, a control signal bSAN1 is activated. One of transistors 52 and 54 is turned on, and the other is turned off in accordance with the relationship in potentials between detection points of the sense amplifiers. With this operation, one of the data lines DQ and bDQ precharged to logic "1" in advance is set at logic "0".

To re-store data from the sense amplifier 50aa to a memory cell, one of the bit lines BL and bBL is set at logic "0" by the transistors 52 and 54 of the sense amplifier 50aa. At this time, the other bit line is normally set at logic "1". However, since the sense amplifier 50aa has no ability for driving a bit line to logic "1", the other bit line is set at a level other than the logic "0" (level which cannot be determined to be logic "1"). Next, when the control signal SAP is activated, one of the pair of load transistors TNLa and TNLb having gates to which the potential of one of the bit lines BL and bBL, which is set at logic "0", is supplied, is turned on to drive the other bit line to logic "1". As a result, one of the bit lines BL and bBL is set at logic "0" while the other is set at logic "1", and data is re-stored in the memory cell.

The sense amplifier system of the fifth embodiment detects a signal of logic "0" as data from a memory cell. However, it may detect a signal of logic "1". More specifically, as shown in FIG. 19, the polarities of transistors shown in FIG. 18 are reversed. In this case, in place of signals SAP, bSAN1, bSAN2, SW1, SW2, CSL1, and CSL2, signals bSAN2, SAN1, SAN2, bSW1, bSW2, bCSL1, and bCSL2 with opposite polarities are supplied to corresponding portions.

Figure 18:
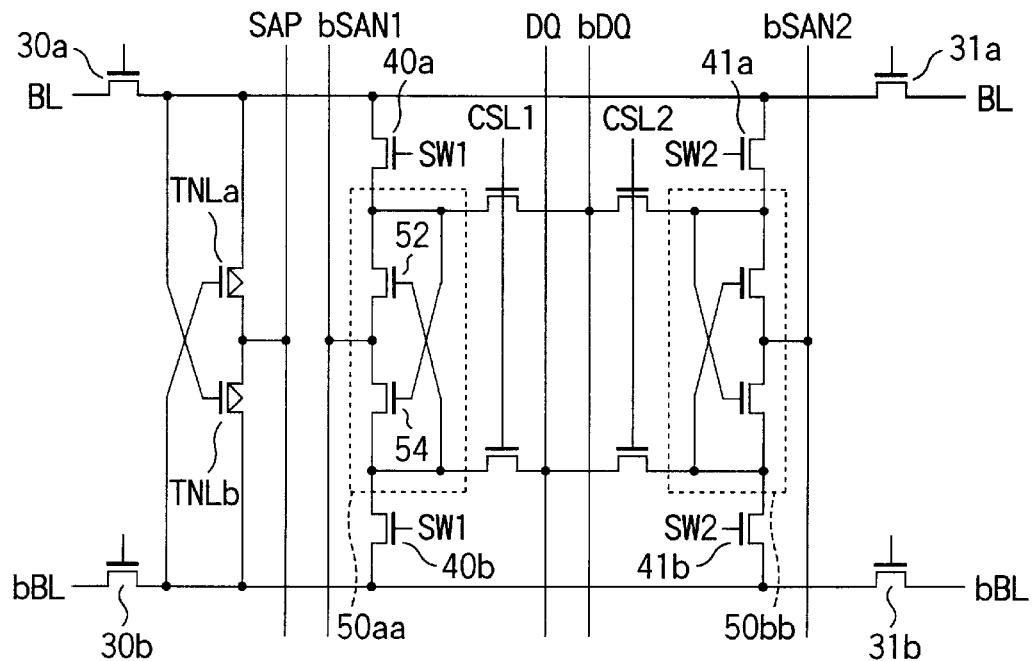
FIG. 18 is a circuit diagram showing a modification of a sense amplifier according to the fifth embodiment of the present invention.
Figure 19:
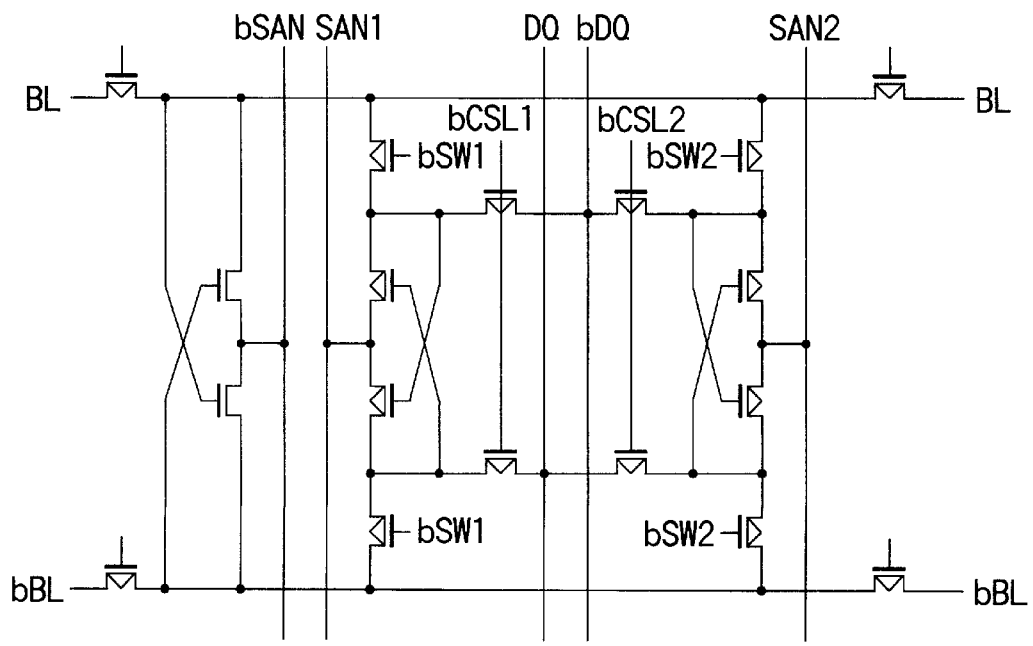
FIG. 19 is a circuit diagram showing another modification of the sense amplifier according to the fifth embodiment of the present invention.

According to the arrangements shown in FIG. 18 and 19, since the number of transistors of a sense amplifier can be reduced, the layout can be facilitated.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
    a memory cell array having memory cells, word lines, and bit line pairs, said memory cells being arranged at intersections between said word lines and said bit line pairs;
    a row decoder for sequentially selecting said word lines, said row decoder having a multiple selection period when a plurality of word lines are simultaneously selected;
    a plurality of sense amplifiers arranged in correspondence with each bit line pair, and configured to amplify data read out from a plurality of said memory cells to one of said bit line pairs; and
    switch circuits provided between said sense amplifiers and said one bit line pair, and configured to connect said one bit line pair and said sense amplifiers.

2. A device according to claim 1, wherein each of said switch circuits comprises at least one transistor for connecting said one bit line pair and one of said sense amplifiers.

3. A device according to claim 1, wherein each of said switch circuits is turned on in synchronism with a selection operation of a word line to transfer data from said one bit line pair to a corresponding sense amplifier.

4. A device according to claim 1, wherein each of said sense amplifiers amplifies data in memory cells selected later in a first half of the multiple selection period of said plurality of word lines and restores the data in previously selected memory cells in a second half of the multiple selection period.

5. A device according to claim 1, wherein each of said sense amplifiers comprises a flip-flop formed by cross-connecting input and output terminals of a pair of CMOS inverters, and one of a PMOS transistor pair and an NMOS transistor pair which form said CMOS inverter is shared by said plurality of sense amplifiers.

6. A device according to claim 1, wherein said row decoder includes:
   a decoding circuit having a synchronous logic circuit for decoding an external row address;
   a plurality of latch circuits for sequentially latching an output signal from said decoding circuit with a phase difference; and
   a driving circuit for driving a word line on the basis of signals latched by said latch circuits.

7. A semiconductor memory device comprising:
   a plurality of memory cell arrays having memory cells, word lines, and bit line pairs, said memory cells being arranged at intersections between said word lines and said bit line pairs;
   a row decoder arranged in correspondence with each memory cell array to sequentially select said word lines, said row decoder having a multiple selection period when a plurality of word lines are simultaneously selected;
   a plurality of first sense amplifiers arranged between adjacent memory cell arrays and shared by bit line pairs of said adjacent memory cell arrays, said first sense amplifiers configured to amplify data read out from said adjacent memory cells to said bit line pairs of said adjacent memory cells;
   a global bit line pair formed commonly for said plurality of memory cell arrays;
   a second sense amplifier connected to said global bit line pair, and configured to amplify data of said global bit line pair;
   a plurality of first switch circuits formed between said first sense amplifiers and said bit line pairs of said memory cell arrays, said first switch circuits configured to connect said bit line pairs and said first sense amplifiers; and
   a plurality of second switch circuits formed between said global bit line pair and said bit line pairs of said memory cell arrays, said second switch circuits configured to connect said global bit line pair and said bit line pairs.

8. A device according to claim 7, wherein each of said first switch circuits comprises at least one transistor for connecting one of said bit line pairs and one of said first sense amplifiers.

9. A device according to claim 7, wherein each of said first switch circuits is turned on in synchronism with a selection operation of a word line to transfer data from one of said bit line pairs to a corresponding first sense amplifier, and each of said second switch circuits is turned on in synchronism with the selection operation of said word line to transfer data from said one bit line pair to said global bit line pair.

10. A device according to claim 7, wherein
   said first and second sense amplifiers amplify data in memory cells selected later in a first half of the multiple selection period of said plurality of word lines and restore the data in previously selected memory cells in a second half of the multiple selection period.

11. A device according to claim 7, wherein each of said first and second sense amplifiers comprises a flip-flop formed by cross-connecting input and output terminals of a pair of CMOS inverters, and one of a PMOS transistor pair and an NMOS transistor pair which form said CMOS inverter is shared by another one of said first and second sense amplifiers.

12. A device according to claim 7, wherein said row decoder includes:
   a decoding circuit having a synchronous logic circuit for decoding an external row address;
   a plurality of latch circuits for sequentially latching an output signal from said decoding circuit with a phase difference; and
   a driving circuit for driving a word line on the basis of signals latched by said latch circuits.

13. A semiconductor memory device comprising:
   first and second memory cell arrays having memory cells, word lines, and bit line pairs, said memory cells being arranged at intersections between said word lines and said bit line pairs;
   a row decoder arranged in correspondence with each of said first and second memory cell arrays to sequentially select said word lines, said row decoder having a multiple selection period when a plurality of word lines are simultaneously selected;
   first and second sense amplifiers arranged in correspondence with each bit line pair of said first and second memory cell arrays, and configured to amplify data of one of said bit line pairs; and
   first switch circuits formed between said first and second sense amplifiers and a bit line pair of said first memory cell array, said first switch circuits configured to selectively connect said first and second sense amplifiers and said bit line pair of said first memory cell array; and
   second switch circuits formed between said first and second sense amplifiers and a bit line pair of said second memory cell array, said second switch circuits configured to selectively connect said first and second sense amplifiers and said bit line pair of said second memory cell array.

14. A device according to claim 13, wherein said first switch circuits comprise first and second transistors for connecting one of said bit line pairs of said first memory cell array and a first sense amplifier and third and fourth transistors for connecting said one bit line pair of said first memory cell array and a second sense amplifier.

15. A device according to claim 13, wherein said second switch circuits comprise first and second transistors for connecting one of said bit line pairs of said second memory cell array and a first sense amplifier and third and fourth transistors for connecting said one bit line pair of said second memory cell array and a second sense amplifier.

16. A device according to claim 13, wherein one of said first switch circuits is turned on in synchronism with a selection operation of a word line to transfer data from one of said bit line pairs to a first sense amplifier, and one of said second switch circuits is turned on in synchronism with the selection operation of said word line to transfer data from one of said bit line pairs to a second sense amplifier.

17. A device according to claim 13, wherein
   said first and second sense amplifiers amplify data in memory cells selected later in a first half of the multiple selection period of said plurality of word lines and restore the data in previously selected memory cells in a second half of the multiple selection period.

18. A device according to claim 13, wherein each of said first and second sense amplifiers comprises a flip-flop formed by cross-connecting input and output terminals of a pair of CMOS inverters, and one of a PMOS transistor pair and an NMOS transistor pair which form said CMOS inverter is shared by another one of said first and second sense amplifiers.

19. A device according to claim 13, wherein said row decoder includes:
   a decoding circuit having a synchronous logic circuit for decoding an external row address;
   a plurality of latch circuits for sequentially latching an output signal from said decoding circuit with a phase difference; and
   a driving circuit for driving a word line on the basis of signals latched by said latch circuits.

20. A semiconductor memory device, comprising:
   a memory cell array having memory cells, word lines, and bit line pairs, said memory cells being arranged at intersections between said word lines and said bit line pairs;
   a row decoder for selecting said word lines;
   a first sense amplifier arranged at one end portion of said bit line pair of said memory cell array to amplify data read out from memory cells to said bit line pair;
   a second sense amplifier arranged at the other end portion of said bit line pair of said memory cell array to amplify data read out from memory cells to said bit line pair;
   first switch circuits formed between said first sense amplifier and one end portion of said bit line pair to transfer data of said bit line pair to said first sense amplifier; and
   second switch circuits formed between said second sense amplifier and the other end portion of said bit line pair to transfer data of said bit line pair to said second sense amplifier.

21. A device according to claim 20, wherein
   said first and second switch circuits are turned on in synchronism with a selection operation of said word line to transfer data from said bit line pair to corresponding sense amplifiers.

22. A device according to claim 20, wherein
   said first switch circuit is turned on in synchronism with a selection operation of said word line to transfer data from said bit line pair to a corresponding first sense amplifier, and said second switch circuit is turned on in synchronism with the selection operation of said word line to transfer data from said bit line pair to a corresponding second sense amplifier.

23. A device according to claim 20, wherein
   said first and second sense amplifiers amplify data in memory cells selected later in a first half of the multiple selection period of said plurality of word lines and re-store the data in previously selected memory cells in a second half of the multiple selection period.

24. A device according to claim 20, wherein
   each of said first and second sense amplifiers comprises a flip-flop formed by cross-connecting input and output terminals of a pair of CMOS inverters, and one of a PMOS transistor pair and an NMOS transistor pair which form said CMOS inverter is shared by said plurality of sense amplifiers.

25. A device according to claim 20, wherein said row decoder includes:
   a decoding circuit having a synchronous logic circuit for decoding an external row address;
   a plurality of latch circuits for sequentially latching an output signal from said decoding circuit with a phase difference; and
   a driving circuit for driving said word line on the basis of signals latched by said latch circuits.

* * * * *